United States Patent
Rong et al.

(10) Patent No.: US 10,348,450 B2
(45) Date of Patent: Jul. 9, 2019

(54) CODING METHOD AND APPARATUS, BASE STATION, AND USER EQUIPMENT

(71) Applicant: HUAWEI TECHNOLOGIES CO., LTD., Shenzhen, Guangdong (CN)

(72) Inventors: Lu Rong, Shanghai (CN); Yalin Liu, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 137 days.

(21) Appl. No.: 15/719,812

(22) Filed: Sep. 29, 2017

(65) Prior Publication Data

US 2018/0026747 A1   Jan. 25, 2018

Related U.S. Application Data

(63) Continuation of application No. PCT/CN2015/075700, filed on Apr. 1, 2015.

(51) Int. Cl.
   *H03M 13/00*   (2006.01)
   *H04L 1/00*    (2006.01)
   *H03M 13/13*   (2006.01)

(52) U.S. Cl.
   CPC .......... *H04L 1/0058* (2013.01); *H03M 13/13* (2013.01); *H03M 13/6356* (2013.01); *H03M 13/6362* (2013.01); *H04L 1/0041* (2013.01)

(58) Field of Classification Search
   None
   See application file for complete search history.

(56) References Cited

U.S. PATENT DOCUMENTS

| 10,135,460 B2 * | 11/2018 | Ionita .................. H03M 5/18 |
| 2012/0240009 A1 | 9/2012  | Kim et al. |

(Continued)

FOREIGN PATENT DOCUMENTS

| CA | 2 891 722   | 5/2014 |
| CN | 103684477 A | 3/2014 |

(Continued)

OTHER PUBLICATIONS

Niu et al., "CRC-Aided Decoding of Polar Codes," IEEE Communications Letters, vol. 16, No. 10, Oct. 2012, XP11469263A, pp. 1668-1671.

(Continued)

*Primary Examiner* — Mujtaba M Chaudry
(74) *Attorney, Agent, or Firm* — Staas & Halsey LLP

(57) ABSTRACT

Embodiments of the present invention provide a coding method and apparatus, a base station, and user equipment. The method includes: determining a quantity of polar codes used to code a to-be-transmitted data block and a block length of each polar code of the polar codes used to code the to-be-transmitted data block; and determining, according to a quantity of bits of the to-be-transmitted data block, the block length of each polar code of the polar codes used to code the to-be-transmitted data block, and an input composite channel characteristic corresponding to each input bit position in the polar code of the polar codes used to code the to-be-transmitted data block, allocation information of valid input bits of the polar code of the polar codes used to code the to-be-transmitted data block. The quantity of polar codes used to code the to-be-transmitted data block is not less than two.

21 Claims, 8 Drawing Sheets

(56) References Cited

U.S. PATENT DOCUMENTS

| | | | |
|---|---|---|---|
| 2014/0040214 A1* | 2/2014 | Ma | H03M 7/30 |
| | | | 707/693 |
| 2015/0091742 A1* | 4/2015 | Ionita | H03M 5/18 |
| | | | 341/57 |
| 2015/0194987 A1 | 7/2015 | Li et al. | |
| 2015/0349909 A1* | 12/2015 | El-Khamy | H04W 72/0466 |
| | | | 370/335 |
| 2015/0381208 A1 | 12/2015 | Li et al. | |
| 2016/0079999 A1 | 3/2016 | Shen et al. | |
| 2016/0204811 A1* | 7/2016 | Goela | H04B 1/123 |
| | | | 375/260 |

FOREIGN PATENT DOCUMENTS

| | | |
|---|---|---|
| CN | 104038234 A | 9/2014 |
| CN | 104219019 A | 12/2014 |
| WO | 2008/042586 A2 | 4/2008 |
| WO | 2015/006947 | 1/2015 |

OTHER PUBLICATIONS

Niu et al., "Beyond Turbo Codes: Rate-Compatible Punctured Polar Codes," IEEE ICC 2013—Communications Theory, XP32522402A, pp. 3423-3427.

Extended European Search Report dated Mar. 8, 2018, in corresponding European Patent Application No. 15886938.8, 12 pgs.

International Search Report dated Jan. 11, 2016 in corresponding International Patent Application No. PCT/CN2015/075700.

International Search Report dated Jan. 11, 2016 in corresponding International Patent Application No. PCT/CN2015/075700, 4 pp.

\* cited by examiner

CODING METHOD AND APPARATUS, BASE STATION, AND USER EQUIPMENT

CROSS-REFERENCE TO RELATED APPLICATIONS

This application is a continuation of International Application No. PCT/CN2015/075700, filed on Apr. 1, 2015, the disclosure of which is hereby incorporated by reference in its entirety.

TECHNICAL FIELD

The present disclosure relates to the communications field, and more specifically, to a coding method and apparatus, a base station, and user equipment.

BACKGROUND

Polar code (polar Code) is a coding technology that has been getting increasing attention in recent years. In the technology, a composite channel is constructed to change a characteristic of an original channel, so as to make a capacity of the composite channel more approach a maximum capacity or minimum capacity. Therefore, the technology is referred to as "polar code". By virtue of this characteristic, based on a proper coding design, polar code can be suitable for a randomly distributed original channel, and implement many different channels that all achieve very good performance and approach a channel capacity. In addition, by using interference cancellation decoding, polar code can significantly reduce receiver complexity and greatly facilitates receiver implementation.

In an existing LTE standard, convolutional codes and turbo codes are mainly used in channel coding. Bit rates of the convolutional codes and turbo codes are fixed at ⅓. That is, a ratio of a quantity of input bits to a quantity of output bits in channel coding is equal to 1:3. In actual transmission, the quantity of input bits depends on a size of a to-be-transmitted data block, and varies with an actual need. The quantity of output bits is related to a size of a physical source block, and varies with a scheduling result. Therefore, a ratio of input bits to output bits in a system is variable. In the LTE standard, a change of the ratio is implemented by puncturing a proper quantity of output bits after channel coding. That is, a quantity of output bits is reduced to implement bit rate matching.

When a to-be-transmitted transport block is relatively large, that is, a quantity of input bits that can be supported by a channel code block is exceeded, the transport block needs to be divided into multiple code blocks (data blocks) for performing channel coding separately. A general block division method is: According to a maximum quantity L of input bits that is supported by a channel code block, L or less bits are intercepted continuously from a transport block, as a code block (data block), till a quantity of remaining bits is less than L. In a specific block division method, proper tuning also needs to be considered. For example, one or more CRC check bits are padded to each code block (data block), and one or more padding bits are padded for matching a resource block size.

Because a polar code has a different structure from a convolutional code and a turbo code and its bit rate is related to a quantity of input bits, a fixed bit rate is unsuitable. Both a quantity of valid input bits and a quantity of valid output bits of the polar code are related to an encoder structure, and are associated with each other. Therefore, it is unsuitable to implement rate matching by puncturing only output bits.

In addition, the polar code has a different characteristic from the convolutional code and the turbo code. Transmission quality of input bits of the polar code is obviously different, and output bits of the polar code have different functions. Therefore, if an existing method is used to divide a transport block, a coding capability of the polar code cannot be fully used.

SUMMARY

In one aspect, embodiments of the present invention provide a coding method and apparatus, a base station, and user equipment. When multiple polar codes are used to transmit data, an input bit position, corresponding to a relatively excellent input composite channel characteristic, of all input bit positions in the multiple polar codes is preferably selected as an information bit position, so that relatively excellent coding performance can be obtained.

In another aspect, the embodiments of the present invention provide a coding method and apparatus, a base station, and user equipment. When multiple polar codes are used to transmit data, an output bit position, corresponding to a relatively excellent output composite channel characteristic, of all output bit positions in the multiple polar codes is preferably selected as a coding bit position, so that relatively excellent coding performance can be obtained.

According to a first aspect, a coding method is provided, where the method includes: determining a quantity of polar codes used to code a to-be-transmitted data block and a block length of each polar code of the polar codes used to code the to-be-transmitted data block; and determining, according to a quantity of bits of the to-be-transmitted data block, the block length of each polar code of the polar codes used to code the to-be-transmitted data block, and an input composite channel characteristic corresponding to each input bit position in the polar code of the polar codes used to code the to-be-transmitted data block, allocation information of valid input bits of the polar code of the polar codes used to code the to-be-transmitted data block, where the quantity of polar codes used to code the to-be-transmitted data block is not less than two, and the quantity of bits of the to-be-transmitted data block exceeds a quantity of input bits that can be supported by any polar code of the polar codes used to code the to-be-transmitted data block.

With reference to the first aspect, in a first possible implementation manner, specific implementation of the determining, according to a quantity of bits of the to-be-transmitted data block, the block length of each polar code of the polar codes used to code the to-be-transmitted data block, and an input composite channel characteristic corresponding to each input bit position in the polar code of the polar codes used to code the to-be-transmitted data block, allocation information of valid input bits of the polar code of the polar codes used to code the to-be-transmitted data block is: allocating, one by one from excellent to poor according to the block length of each polar code of the polar codes used to code the to-be-transmitted data block and the input composite channel characteristic corresponding to each input bit position in the polar code of the polar codes used to code the to-be-transmitted data block, the valid input bits of the polar code of the polar codes used to code the to-be-transmitted data block, till all bits of the to-be-transmitted data block are allocated.

With reference to the first aspect, in a second possible implementation manner, specific implementation of the determining, according to a quantity of bits of the to-be-transmitted data block, the block length of each polar code of the polar codes used to code the to-be-transmitted data block, and an input composite channel characteristic corresponding to each input bit position in the polar code of the polar codes used to code the to-be-transmitted data block, allocation information of valid input bits of the polar code of the polar codes used to code the to-be-transmitted data block is: allocating, one by one from poor to excellent according to the block length of each polar code of the polar codes used to code the to-be-transmitted data block and the input composite channel characteristic corresponding to each input bit position in the polar code of the polar codes used to code the to-be-transmitted data block, padding bits of the polar code of the polar codes used to code the to-be-transmitted data block, till all padding bits required for coding the to-be-transmitted data block are allocated.

With reference to the first aspect, in a third possible implementation manner, specific implementation of the determining, according to a quantity of bits of the to-be-transmitted data block, the block length of each polar code of the polar codes used to code the to-be-transmitted data block, and an input composite channel characteristic corresponding to each input bit position in the polar code of the polar codes used to code the to-be-transmitted data block, allocation information of valid input bits of the polar code of the polar codes used to code the to-be-transmitted data block is: allocating, according to the quantity of bits of the to-be-transmitted data block, the block length of each polar code of the polar codes used to code the to-be-transmitted data block, and the input composite channel characteristic corresponding to each input bit position in the polar code of the polar codes used to code the to-be-transmitted data block, a content bit of the to-be-transmitted data block to an input bit position, corresponding to a relatively excellent input composite channel characteristic, in the polar code used to code the to-be-transmitted data block, so that a difference between quantities of valid input bits of any two polar codes of the polar codes used to code the to-be-transmitted data block is less than a first predetermined threshold, where a quantity of valid input bits of the polar code is a quantity of content bits allocated to the to-be-transmitted data block, and each polar code of the polar codes used to code the to-be-transmitted data block has a same block length.

With reference to the first aspect, in a fourth possible implementation manner, specific implementation of the determining, according to a quantity of bits of the to-be-transmitted data block, the block length of each polar code of the polar codes used to code the to-be-transmitted data block, and an input composite channel characteristic corresponding to each input bit position in the polar code of the polar codes used to code the to-be-transmitted data block, allocation information of valid input bits of the polar code of the polar codes used to code the to-be-transmitted data block is: allocating, according to the quantity of bits of the to-be-transmitted data block, the block length of each polar code of the polar codes used to code the to-be-transmitted data block, and the input composite channel characteristic corresponding to each input bit position in the polar code of the polar codes used to code the to-be-transmitted data block, a padding bit required for coding the to-be-transmitted data block to an input bit position, corresponding to a relatively poor input composite channel characteristic, in the polar code used to code the to-be-transmitted data block, so that a difference between quantities of valid input bits of any two polar codes of the polar codes used to code the to-be-transmitted data block is less than a first predetermined threshold, and allocating a content bit of the to-be-transmitted data block to a remaining input bit position in the polar code of the polar codes used to code the to-be-transmitted data block, where a quantity of valid input bits of the polar code is a quantity of content bits allocated to the to-be-transmitted data block, and each polar code of the polar codes used to code the to-be-transmitted data block has a same block length.

With reference to either possible implementation manner of the third possible implementation manner of the first aspect and the fourth possible implementation manner of the first aspect, in a fifth possible implementation manner, specific implementation is: The first predetermined threshold is equal to five times a highest modulation order of all modulation orders of the polar codes used to code the to-be-transmitted data block.

With reference to the first aspect or any possible implementation manner of the first possible implementation manner of the first aspect to the fifth possible implementation manner of the first aspect, in a sixth possible implementation manner, specific implementation is: The input composite channel characteristic includes at least one of the following: a capacity of an input composite channel, an error probability of an input composite channel, or a position indicator corresponding to an input composite channel.

With reference to the sixth possible implementation manner of the first aspect, in a seventh possible implementation manner, specific implementation is: The position indicator corresponding to an input composite channel is obtained by means of calculation according to a parameter equation corresponding to a polar code of the input composite channel and an input bit position corresponding to the input composite channel; or the position indicator corresponding to an input composite channel is obtained by means of table lookup according to an indicator mapping table corresponding to a polar code of the input composite channel and an input bit position corresponding to the input composite channel.

With reference to the first aspect or any possible implementation manner of the first possible implementation manner of the first aspect to the seventh possible implementation manner of the first aspect, in an eighth possible implementation manner, the method further includes: determining, according to a quantity of bits that can be transmitted by a physical transmission resource block of the to-be-transmitted data block, the block length of each polar code of the polar codes used to code the to-be-transmitted data block, and an output composite channel characteristic corresponding to each Output bit position in the polar code of the polar codes used to code the to-be-transmitted data block, allocation information of valid output bits of the polar code of the polar codes used to code the to-be-transmitted data block.

With reference to the eighth possible implementation manner of the first aspect, in a ninth possible implementation manner, specific implementation of the determining, according to a quantity of bits that can be transmitted by a physical transmission resource block of the to-be-transmitted data block, the block length of each polar code of the polar codes used to code the to-be-transmitted data block, and an output composite channel characteristic corresponding to each output bit position in the polar code of the polar codes used to code the to-be-transmitted data block, allocation information of valid output bits of the polar code of the polar codes used to code the to-be-transmitted data block is: allocating, one by one from excellent to poor according to the block length of each polar code of the polar codes used to code the to-be-transmitted data block and the output composite channel characteristic corresponding to each output bit position in the polar code of the polar codes used to code the to-be-transmitted data block, the valid output bits of the polar code of the polar codes used to code the to-be-transmitted data block, till all bits that can be transmitted by the physical transmission resource block of the to-be-transmitted data block are allocated.

With reference to the eighth possible implementation manner of the first aspect, in a tenth possible implementation manner, specific implementation of the determining, according to a quantity of bits that can be transmitted by a physical transmission resource block of the to-be-transmitted data block, the block length of each polar code of the polar codes used to code the to-be-transmitted data block, and an output composite channel characteristic corresponding to each output bit position in the polar code of the polar codes used to code the to-be-transmitted data block, allocation information of valid output bits of the polar code of the polar codes used to code the to-be-transmitted data block is: allocating, one by one from poor to excellent according to the block length of each polar code of the polar codes used to code the to-be-transmitted data block and the output composite channel characteristic corresponding to each output bit position in the polar code of the polar codes used to code the to-be-transmitted data block, punctured bits of the polar code of the polar codes used to code the to-be-transmitted data block, till all punctured bits required for transmitting the to-be-transmitted data block are allocated, where a quantity of the punctured bits required for transmitting the to-be-transmitted data block is equal to a sum of block lengths of the polar codes used to code the to-be-transmitted data block minus the quantity of bits that can be transmitted by the physical transmission resource block of the to-be-transmitted data block.

With reference to the eighth possible implementation manner of the first aspect, in an eleventh possible implementation manner, specific implementation of the determining, according to a quantity of bits that can be transmitted by a physical transmission resource block of the to-be-transmitted data block, the block length of each polar code of the polar codes used to code the to-be-transmitted data block, and an output composite channel characteristic corresponding to each output bit position in the polar code of the polar codes used to code the to-be-transmitted data block, allocation information of valid output bits of the polar code of the polar codes used to code the to-be-transmitted data block is: allocating, according to the block length of each polar code of the polar codes used to code the to-be-transmitted data block and the output composite channel characteristic corresponding to each output bit position in the polar code of the polar codes used to code the to-be-transmitted data block, a bit that can be transmitted by the physical transmission resource block of the to-be-transmitted data block to an output bit position, corresponding to a relatively excellent output composite channel characteristic, in the polar code used to code the to-be-transmitted data block, so that a difference between quantities of valid output bits of any two polar codes of the polar codes used to code the to-be-transmitted data block is less than a second predetermined threshold, where a quantity of valid output bits of the polar code is a quantity of remaining bits obtained after output bits of the polar code are punctured, and each polar code of the polar codes used to code the to-be-transmitted data blocks has a same block length.

With reference to the eighth possible implementation manner of the first aspect, in a twelfth possible implementation manner, specific implementation of the determining, according to a quantity of bits that can be transmitted by a physical transmission resource block of the to-be-transmitted data block, the block length of each polar code of the polar codes used to code the to-be-transmitted data block, and an output composite channel characteristic corresponding to each output bit position in the polar code of the polar codes used to code the to-be-transmitted data block, allocation information of valid output bits of the polar code of the polar codes used to code the to-be-transmitted data block is: allocating, according to the block length of each polar code of the polar codes used to code the to-be-transmitted data block and the output composite channel characteristic corresponding to each output bit position in the polar code of the polar codes used to code the to-be-transmitted data block, a punctured bit required for coding the to-be-transmitted data block to an output bit position, corresponding to a relatively poor output composite channel characteristic, in the polar code used to code the to-be-transmitted data block, so that a difference between quantities of valid output bits of any two polar codes of the polar codes used to code the to-be-transmitted data block is less than a second predetermined threshold, and allocating a bit that can be transmitted by the physical transmission resource block of the to-be-transmitted data block to a remaining output bit position in the polar code of the polar codes used to code the to-be-transmitted data block, where a quantity of valid output bits of the polar code is equal to a block length of the polar code minus a quantity of punctured bits of the polar code, and each polar code of the polar codes used to code the to-be-transmitted data blocks has a same block length.

With reference to the eleventh possible implementation manner of the first aspect or the twelfth possible implementation manner of the first aspect, in a thirteenth possible implementation manner, specific implementation is: The second predetermined threshold is equal to six times a highest modulation order of all modulation orders of the polar codes used to code the to-be-transmitted data block.

With reference to the first aspect or any possible implementation manner of the first possible implementation manner of the first aspect to the thirteenth possible implementation manner of the first aspect, in a fourteenth possible implementation manner, specific implementation is: The output composite channel characteristic includes at least one of the following: a capacity of an output composite channel, an error probability of an output composite channel, or a position indicator corresponding to an output composite channel.

With reference to the fourteenth possible implementation manner, in a fifteenth possible implementation manner, specific implementation is: The position indicator corresponding to an output composite channel is obtained by means of calculation according to a parameter equation corresponding to a polar code of the output composite channel and an output bit position corresponding to the output composite channel; or the position indicator corresponding to an output composite channel is obtained by means of table lookup according to an indicator mapping table corresponding to a polar code of the output composite channel and an output bit position corresponding to the output composite channel.

With reference to the first aspect or any possible implementation manner of the first possible implementation manner of the first aspect to the fifteenth possible implementation manner of the first aspect, in a sixteenth possible implementation manner, the method further includes receiving resource assignment information sent by a peer node, where the resource assignment information carries the quantity of polar codes used to code the to-be-transmitted data block and block length information of each polar code of the polar codes used to code the to-be-transmitted data block; and specific implementation of the determining a quantity of polar codes used to code a to-be-transmitted data block and a block length of each polar code of the polar codes used to code the to-be-transmitted data block is: determining, according to the resource assignment information, the quantity of polar codes used to code the to-be-transmitted data block and the block length information of the polar code of the polar codes used to code the to-be-transmitted data block.

With reference to the first aspect or any possible implementation manner of the first possible implementation manner of the first aspect to the fifteenth possible implementation manner of the first aspect, in a sixteenth possible implementation manner, specific implementation of the determining a quantity of polar codes used to code a to-be-transmitted data block and a block length of each polar code of the polar codes used to code the to-be-transmitted data block is: determining, according to the quantity of bits of the to-be-transmitted data block, the quantity of polar codes used to code the to-be-transmitted data block and the block length of the polar code of the polar codes used to code the to-be-transmitted data block.

According to a second aspect, a coding method is provided, where the method includes: determining a quantity of polar codes used to code a to-be-transmitted data block and a block length of each polar code of the polar codes used to code the to-be-transmitted data block; and determining, according to a quantity of bits that can be transmitted by a physical transmission resource block of the to-be-transmitted data block, the block length of each polar code of the polar codes used to code the to-be-transmitted data block, and an output composite channel characteristic corresponding to each output bit position in the polar code of the polar codes used to code the to-be-transmitted data block, allocation information of valid output bits of the polar code of the polar codes used to code the to-be-transmitted data block, where the quantity of polar codes used to code the to-be-transmitted data block is not less than two, and a quantity of bits of the to-be-transmitted data block exceeds a quantity of input bits that can be supported by any polar code of the polar codes used to code the to-be-transmitted data block.

With reference to the second aspect, in a first possible implementation manner, specific implementation of the determining, according to a quantity of bits that can be transmitted by a physical transmission resource block of the to-be-transmitted data block, the block length of each polar code of the polar codes used to code the to-be-transmitted data block, and an output composite channel characteristic corresponding to each output bit position in the polar code of the polar codes used to code the to-be-transmitted data block, allocation information of valid output bits of the polar code of the polar codes used to code the to-be-transmitted data block is: allocating, one by one from excellent to poor according to the block length of each polar code of the polar codes used to code the to-be-transmitted data block and the output composite channel characteristic corresponding to each output bit position in the polar code of the polar codes used to code the to-be-transmitted data block, the valid output bits of the polar code of the polar codes used to code the to-be-transmitted data block, till all bits that can be transmitted by the physical transmission resource block of the to-be-transmitted data block are allocated.

With reference to the second aspect, in a second possible implementation manner, specific implementation of the determining, according to a quantity of bits that can be transmitted by a physical transmission resource block of the to-be-transmitted data block, the block length of each polar code of the polar codes used to code the to-be-transmitted data block, and an output composite channel characteristic corresponding to each output bit position in the polar code of the polar codes used to code the to-be-transmitted data block, allocation information of valid output bits of the polar code of the polar codes used to code the to-be-transmitted data block is: allocating, one by one from poor to excellent according to the block length of each polar code of the polar codes used to code the to-be-transmitted data block and the output composite channel characteristic corresponding to each output bit position in the polar code of the polar codes used to code the to-be-transmitted data block, punctured bits of the polar code of the polar codes used to code the to-be-transmitted data block, till all punctured bits required for transmitting the to-be-transmitted data block are allocated, where a quantity of the punctured bits required for transmitting the to-be-transmitted data block is equal to a sum of block lengths of the polar codes used to code the to-be-transmitted data block minus the quantity of bits that can be transmitted by the physical transmission resource block of the to-be-transmitted data block.

With reference to the second aspect, in a third possible implementation manner, specific implementation of the determining, according to a quantity of bits that can be transmitted by a physical transmission resource block of the to-be-transmitted data block, the block length of each polar code of the polar codes used to code the to-be-transmitted data block, and an output composite channel characteristic corresponding to each output bit position in the polar code of the polar codes used to code the to-be-transmitted data block, allocation information of valid output bits of the polar code of the polar codes used to code the to-be-transmitted data block is: allocating, according to the block length of each polar code of the polar codes used to code the to-be-transmitted data block and the output composite channel characteristic corresponding to each output bit position in the polar code of the polar codes used to code the to-be-transmitted data block, a bit that can be transmitted by the physical transmission resource block of the to-be-transmitted data block to an output bit position, corresponding to a relatively excellent output composite channel characteristic, in the polar code used to code the to-be-transmitted data block, so that a difference between quantities of valid output bits of any two polar codes of the polar codes used to code the to-be-transmitted data block is less than a second predetermined threshold, where a quantity of valid output bits of the polar code is a quantity of remaining bits obtained after output bits of the polar code are punctured, and each polar code of the polar codes used to code the to-be-transmitted data blocks has a same block length.

With reference to the second aspect, in a fourth possible implementation manner, specific implementation of the determining, according to a quantity of bits that can be transmitted by a physical transmission resource block of the to-be-transmitted data block, the block length of each polar code of the polar codes used to code the to-be-transmitted data block, and an output composite channel characteristic corresponding to each output bit position in the polar code of the polar codes used to code the to-be-transmitted data block, allocation information of valid output bits of the polar code of the polar codes used to code the to-be-transmitted data block is: allocating, according to the block length of each polar code of the polar codes used to code the to-be-transmitted data block and the output composite channel characteristic corresponding to each output bit position in the polar code of the polar codes used to code the to-be-transmitted data block, a punctured bit required for coding the to-be-transmitted data block to an output bit position, corresponding to a relatively poor output composite channel characteristic, in the polar code used to code the to-be-transmitted data block, so that a difference between quantities of valid output bits of any two polar codes of the polar codes used to code the to-be-transmitted data block is less than a second predetermined threshold, and allocating a bit that can be transmitted by the physical transmission resource block of the to-be-transmitted data block to a remaining output bit position in the polar code of the polar codes used to code the to-be-transmitted data block, where a quantity of valid output bits of the polar code is equal to a block length of the polar code minus a quantity of punctured bits of the polar code, and each polar code of the polar codes used to code the to-be-transmitted data blocks has a same block length.

According to a third aspect, a coding apparatus is provided, where the apparatus includes: a first determining unit, configured to determine a quantity of polar codes used to code a to-be-transmitted data block and a block length of each polar code of the polar codes used to code the to-be-transmitted data block; and a second determining unit, configured to determine, according to the block length of each polar code of the polar codes used to code the to-be-transmitted data block, and the input composite channel characteristic corresponding to each input bit position in the polar code of the polar codes used to code the to-be-transmitted data block, allocation information of valid input bits of the polar code of the polar codes used to code the to-be-transmitted data block, where the quantity of polar codes used to code the to-be-transmitted data block is not less than two, and a quantity of bits of the to-be-transmitted data block exceeds a quantity of input bits that can be supported by any polar code of the polar codes used to code the to-be-transmitted data block.

With reference to the third aspect, in a first possible implementation manner, the second determining unit is specifically configured to: allocate, one by one from excellent to poor according to the block length of each polar code of the polar codes used to code the to-be-transmitted data block and the input composite channel characteristic corresponding to each input bit position in the polar code of the polar codes used to code the to-be-transmitted data block, the valid input bits of the polar code of the polar codes used to code the to-be-transmitted data block, till all bits of the to-be-transmitted data block are allocated.

With reference to the third aspect, in a second possible implementation manner, the second determining unit is specifically configured to: allocate, one by one from poor to excellent according to the block length of each polar code of the polar codes used to code the to-be-transmitted data block and the input composite channel characteristic corresponding to each input bit position in the polar code of the polar codes used to code the to-be-transmitted data block, padding bits of the polar code of the polar codes used to code the to-be-transmitted data block, till all padding bits required for coding the to-be-transmitted data block are allocated.

With reference to the third aspect, in a third possible implementation manner, the second determining unit is specifically configured to: allocate, according to the quantity of bits of the to-be-transmitted data block, the block length of each polar code of the polar codes used to code the to-be-transmitted data block, and the input composite channel characteristic corresponding to each input bit position in the polar code of the polar codes used to code the to-be-transmitted data block, a content bit of the to-be-transmitted data block to an input bit position, corresponding to a relatively excellent input composite channel characteristic, in the polar code used to code the to-be-transmitted data block, so that a difference between quantities of valid input bits of any two polar codes of the polar codes used to code the to-be-transmitted data block is less than a first predetermined threshold, where a quantity of valid input bits of the polar code is a quantity of content bits allocated to the to-be-transmitted data block, and each polar code of the polar codes used to code the to-be-transmitted data block has a same block length.

With reference to the third aspect, in a fourth possible implementation manner, the second determining unit is specifically configured to: allocate, according to the quantity of bits of the to-be-transmitted data block, the block length of each polar code of the polar codes used to code the to-be-transmitted data block, and the input composite channel characteristic corresponding to each input bit position in the polar code of the polar codes used to code the to-be-transmitted data block, a padding bit required for coding the to-be-transmitted data block to an input bit position, corresponding to a relatively poor input composite channel characteristic, in the polar code used to code the to-be-transmitted data block, so that a difference between quantities of valid input bits of any two polar codes of the polar codes used to code the to-be-transmitted data block is less than a first predetermined threshold, and allocate a content bit of the to-be-transmitted data block to a remaining input bit position in the polar code of the polar codes used to code the to-be-transmitted data block, where a quantity of valid input bits of the polar code is a quantity of content bits allocated to the to-be-transmitted data block, and each polar code of the polar codes used to code the to-be-transmitted data block has a same block length.

With reference to either possible implementation manner of the third possible implementation manner of the third aspect and the fourth possible implementation manner of the third aspect, in a fifth possible implementation manner, specific implementation is: The first predetermined threshold is equal to five times a highest modulation order of all modulation orders of the polar codes used to code the to-be-transmitted data block.

With reference to the third aspect or any possible implementation manner of the first possible implementation manner of the third aspect to the fifth possible implementation manner of the third aspect, in a sixth possible implementation manner, specific implementation is: The input composite channel characteristic includes at least one of the following: a capacity of an input composite channel, an error probability of an input composite channel, or a position indicator corresponding to an input composite channel.

With reference to the sixth possible implementation manner of the third aspect, in a seventh possible implementation manner, specific implementation is: The position indicator corresponding to an input composite channel is obtained by means of calculation according to a parameter equation corresponding to a polar code of the input composite channel and an input bit position corresponding to the input composite channel; or the position indicator corresponding to an input composite channel is obtained by means of table lookup according to an indicator mapping table corresponding to a polar code of the input composite channel and an input bit position corresponding to the input composite channel.

With reference to the third aspect or any possible implementation manner of the first possible implementation manner of the third aspect to the seventh possible implementation manner of the third aspect, in an eighth possible implementation manner, the coding apparatus further includes: a third determining unit, configured to determine, according to a quantity of bits that can be transmitted by a physical transmission resource block of the to-be-transmitted data block, the block length of each polar code of the polar codes used to code the to-be-transmitted data block, and an output composite channel characteristic corresponding to each output bit position in the polar code of the polar codes used to code the to-be-transmitted data block, allocation information of valid output bits of the polar code of the polar codes used to code the to-be-transmitted data block.

With reference to the eighth possible implementation manner of the third aspect, in a ninth possible implementation manner, the third determining unit is specifically configured to: allocate, one by one from excellent to poor according to the block length of each polar code of the polar codes used to code the to-be-transmitted data block and the output composite channel characteristic corresponding to each output bit position in the polar code of the polar codes used to code the to-be-transmitted data block, the valid output bits of the polar code of the polar codes used to code the to-be-transmitted data block, till all bits that can be transmitted by the physical transmission resource block of the to-be-transmitted data block are allocated.

With reference to the eighth possible implementation manner of the third aspect, in a tenth possible implementation manner, the third determining unit is specifically configured to: allocate, one by one from poor to excellent according to the block length of each polar code of the polar codes used to code the to-be-transmitted data block and the output composite channel characteristic corresponding to each output bit position in the polar code of the polar codes used to code the to-be-transmitted data block, punctured bits of the polar code of the polar codes used to code the to-be-transmitted data block, till all punctured bits required for transmitting the to-be-transmitted data block are allocated, where a quantity of the punctured bits required for transmitting the to-be-transmitted data block is equal to a sum of block lengths of the polar codes used to code the to-be-transmitted data block minus the quantity of bits that can be transmitted by the physical transmission resource block of the to-be-transmitted data block.

With reference to the eighth possible implementation manner of the third aspect, in an eleventh possible implementation manner, the third determining unit is specifically configured to: allocate, according to the block length of each polar code of the polar codes used to code the to-be-transmitted data block and the output composite channel characteristic corresponding to each output bit position in the polar code of the polar codes used to code the to-be-transmitted data block, a bit that can be transmitted by the physical transmission resource block of the to-be-transmitted data block to an output bit position, corresponding to a relatively excellent output composite channel characteristic, in the polar code used to code the to-be-transmitted data block, so that a difference between quantities of valid output bits of any two polar codes of the polar codes used to code the to-be-transmitted data block is less than a second predetermined threshold, where a quantity of valid output bits of the polar code is a quantity of remaining bits obtained after output bits of the polar code are punctured, and each polar code of the polar codes used to code the to-be-transmitted data blocks has a same block length.

With reference to the eighth possible implementation manner of the third aspect, in a twelfth possible implementation manner, the third determining unit is specifically configured to: allocate, according to the block length of each polar code of the polar codes used to code the to-be-transmitted data block and the output composite channel characteristic corresponding to each output bit position in the polar code of the polar codes used to code the to-be-transmitted data block, a punctured bit required for coding the to-be-transmitted data block to an output bit position, corresponding to a relatively poor output composite channel characteristic, in the polar code used to code the to-be-transmitted data block, so that a difference between quantities of valid output bits of any two polar codes of the polar codes used to code the to-be-transmitted data block is less than a second predetermined threshold, and allocate a bit that can be transmitted by the physical transmission resource block of the to-be-transmitted data block to a remaining output bit position in the polar code of the polar codes used to code the to-be-transmitted data block, where a quantity of valid output bits of the polar code is equal to a block length of the polar code minus a quantity of punctured bits of the polar code, and each polar code of the polar codes used to code the to-be-transmitted data blocks has a same block length.

With reference to the eleventh possible implementation manner of the third aspect or the twelfth possible implementation manner of the third aspect, in a thirteenth possible implementation manner, specific implementation is: The second predetermined threshold is equal to six times a highest modulation order of all modulation orders of the polar codes used to code the to-be-transmitted data block.

With reference to the third aspect or any possible implementation manner of the first possible implementation manner of the third aspect to the thirteenth possible implementation manner of the third aspect, in a fourteenth possible implementation manner, specific implementation is: The output composite channel characteristic includes at least one of the following: a capacity of an output composite channel, an error probability of an output composite channel, or a position indicator corresponding to an output composite channel.

With reference to the fourteenth possible implementation manner, in a fifteenth possible implementation manner, specific implementation is: The position indicator corresponding to an output composite channel is obtained by means of calculation according to a parameter equation corresponding to a polar code of the output composite channel and an output bit position corresponding to the output composite channel; or the position indicator corresponding to an output composite channel is obtained by means of table lookup according to an indicator mapping table corresponding to a polar code of the output composite channel and an output bit position corresponding to the output composite channel.

With reference to the third aspect or any possible implementation manner of the first possible implementation manner of the third aspect to the fifteenth possible implementation manner of the third aspect, in a sixteenth possible implementation manner, the coding apparatus further includes a receiving unit, configured to receive resource assignment information sent by a peer node, where the resource assignment information carries the quantity of polar codes used to code the to-be-transmitted data block and block length information of each polar code of the polar codes used to code the to-be-transmitted data block; and the first determining unit is specifically configured to determine, according to the resource assignment information, the quantity of polar codes used to code the to-be-transmitted data block and the block length information of the polar code of the polar codes used to code the to-be-transmitted data block.

With reference to the third aspect or any possible implementation manner of the first possible implementation manner of the third aspect to the fifteenth possible implementation manner of the third aspect, in a sixteenth possible implementation manner, the first determining unit is specifically configured to determine, according to the quantity of bits of the to-be-transmitted data block, the quantity of polar codes used to code the to-be-transmitted data block and the block length of each polar code of the polar codes used to code the to-be-transmitted data block.

According to a fourth aspect, a coding apparatus is provided, where the apparatus includes: a first determining unit, configured to determine a quantity of polar codes used to code a to-be-transmitted data block and a block length of each polar code of the polar codes used to code the to-be-transmitted data block; and a second determining unit, configured to determine, according to a quantity of bits that can be transmitted by a physical transmission resource block of the to-be-transmitted data block, the block length of each polar code of the polar codes used to code the to-be-transmitted data block, and an output composite channel characteristic corresponding to each output bit position in the polar code of the polar codes used to code the to-be-transmitted data block, allocation information of valid output bits of the polar code of the polar codes used to code the to-be-transmitted data block, where the quantity of polar codes used to code the to-be-transmitted data block is not less than two, and a quantity of bits of the to-be-transmitted data block exceeds a quantity of input bits that can be supported by any polar code of the polar codes used to code the to-be-transmitted data block.

With reference to the fourth aspect, in a first possible implementation manner, the second determining unit is specifically configured to: allocate, one by one from excellent to poor according to the block length of each polar code of the polar codes used to code the to-be-transmitted data block and the output composite channel characteristic corresponding to each output bit position in the polar code of the polar codes used to code the to-be-transmitted data block, the valid output bits of the polar code of the polar codes used to code the to-be-transmitted data block, till all bits that can be transmitted by the physical transmission resource block of the to-be-transmitted data block are allocated.

With reference to the fourth aspect, in a second possible implementation manner, the second determining unit is specifically configured to: allocate, one by one from poor to excellent according to the block length of each polar code of the polar codes used to code the to-be-transmitted data block and the output composite channel characteristic corresponding to each output bit position in the polar code of the polar codes used to code the to-be-transmitted data block, punctured bits of the polar code of the polar codes used to code the to-be-transmitted data block, till all punctured bits required for transmitting the to-be-transmitted data block are allocated, where a quantity of the punctured bits required for transmitting the to-be-transmitted data block is equal to a sum of block lengths of the polar codes used to code the to-be-transmitted data block minus the quantity of bits that can be transmitted by the physical transmission resource block of the to-be-transmitted data block.

With reference to the fourth aspect, in a third possible implementation manner, specific implementation is: The second determining unit is specifically configured to: allocate, according to the block length of each polar code of the polar codes used to code the to-be-transmitted data block and the output composite channel characteristic corresponding to each output bit position in the polar code of the polar codes used to code the to-be-transmitted data block, a bit that can be transmitted by the physical transmission resource block of the to-he-transmitted data block to an output bit position, corresponding to a relatively excellent output composite channel characteristic, in the polar code used to code the to-be-transmitted data block, so that a difference between quantities of valid output bits of any two polar codes of the polar codes used to code the to-be-transmitted data block is less than a second predetermined threshold, where a quantity of valid output bits of the polar code is a quantity of remaining bits obtained after output bits of the polar code are punctured, and each polar code of the polar codes used to code the to-be-transmitted data blocks has a same block length.

With reference to the fourth aspect, in a fourth possible implementation manner, specific implementation is: The second determining unit is specifically configured to allocate, according to the block length of each polar code of the polar codes used to code the to-be-transmitted data block and the output composite channel characteristic corresponding to each output bit position in the polar code of the polar codes used to code the to-be-transmitted data block, a punctured bit required for coding the to-be-transmitted data block to an output bit position, corresponding to a relatively poor output composite channel characteristic, in the polar code used to code the to-be-transmitted data block, so that a difference between quantities of valid output bits of any two polar codes of the polar codes used to code the to-be-transmitted data block is less than a second predetermined threshold, and allocate a bit that can be transmitted by the physical transmission resource block of the to-be-transmitted data block to a remaining output bit position in the polar code of the polar codes used to code the to-be-transmitted data block, where a quantity of valid output bits of the polar code is equal to a block length of the polar code minus a quantity of punctured bits of the polar code, and each polar code of the polar codes used to code the to-be-transmitted data blocks has a same block length.

According to a fifth aspect, a base station is provided, where the base station includes a coding apparatus, and the coding apparatus may be the coding apparatus according to the third aspect or the first possible implementation manner of the third aspect to the sixteenth possible implementation manner of the third aspect, or the coding apparatus according to the fourth aspect or the first possible implementation manner of the fourth aspect to the fourth possible implementation manner of the fourth aspect.

According to a sixth aspect, user equipment is provided, where the user equipment includes a coding apparatus, and the coding apparatus may be the coding apparatus according to the third aspect or the first possible implementation manner of the third aspect to the sixteenth possible implementation manner of the third aspect, or the coding apparatus according to the fourth aspect or the first possible implementation manner of the fourth aspect to the fourth possible implementation manner of the fourth aspect.

In one aspect, based on the foregoing technical solutions, according to the coding method and apparatus, the base station, and the user equipment in the embodiments of the present invention, when multiple polar codes are used to transmit data, an input bit position, corresponding to a relatively excellent input composite channel characteristic, of all input bit positions in the multiple polar codes is selected as an information bit position according to input composite channel characteristics corresponding to input bit positions in the polar codes, so that relatively excellent coding performance can be obtained.

In another aspect, based on the foregoing technical solutions, according to the coding method and apparatus, the base station, and the user equipment in the embodiments of the present invention, when multiple polar codes are used to transmit data, an output bit position, corresponding to a relatively excellent output composite channel characteristic, of all output bit positions in the multiple polar codes is selected as a coding bit position according to output composite channel characteristics corresponding to output bit positions in the polar codes, so that relatively excellent coding performance can be obtained.

BRIEF DESCRIPTION OF DRAWINGS

To describe the technical solutions in the embodiments of the present invention more clearly, the following briefly describes the accompanying drawings required for describing the embodiments or the prior art. Apparently, the accompanying drawings in the following description show merely some embodiments of the present invention, and a person of ordinary skill in the art may still derive other drawings from these accompanying drawings without creative efforts.

DESCRIPTION OF EMBODIMENTS

Figure 1:
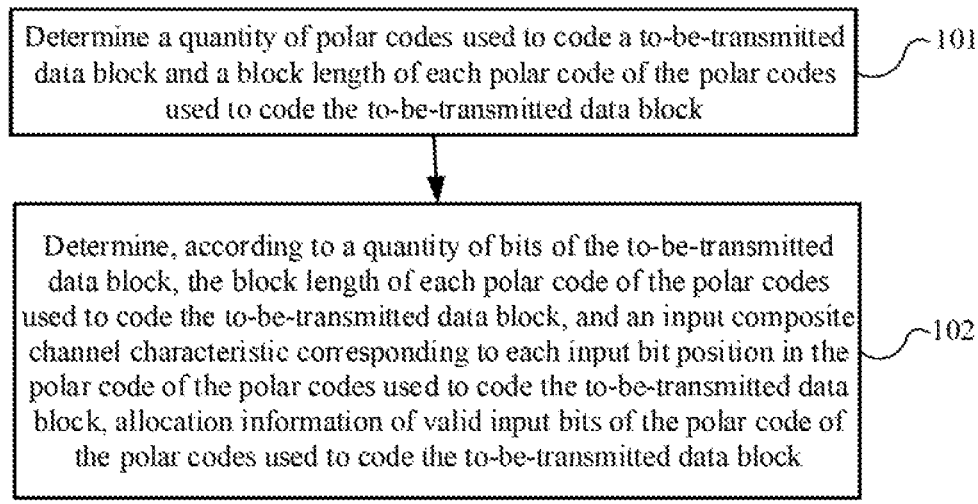
FIG. 1 is a flowchart of a coding method according to an embodiment of the present invention.

The following clearly describes the technical solutions in the embodiments of the present invention with reference to the accompanying drawings in the embodiments of the present invention. Apparently, the described embodiments are some but not all of the embodiments of the present invention. All other embodiments obtained by a person of ordinary skill in the art based on the embodiments of the present invention without creative efforts shall fall within the protection scope of the present invention.

The technical solutions of the present invention may be applied to various communications systems, such as: a Global System for Mobile Communications (GSM), a Code Division Multiple Access (CDMA) system, a Wideband Code Division Multiple Access (WCDMA) system, a general packet radio service (GPRS) system, and a Long Term Evolution (LTE) system.

User equipment (UE), also referred to as a mobile terminal, mobile user equipment, and the like, may communicate with one or more core networks through a radio access network (for example, RAN). The user equipment may be a mobile terminal, such as a mobile phone (also referred to as a "cellular" phone) and a computer with a mobile terminal. For example, the user equipment may be a portable, pocket-sized, handheld, computer built-in, or in-vehicle mobile apparatus, which exchanges voice and/or data with the radio access network.

A base station may be a base station (BTS) in GSM or CDMA, or may be a base station (NodeB) in WCDMA, or may be an evolved NodeB (eNB or e-NodeB) in LTE, which is not limited in the present invention. However, for ease of description, the following embodiments are described by using an eNB as an example.

A modulation order is a quantity of bits transmitted on a modulated symbol. For example, a modulation order of quadrature phase shift keying (QPSK) is 2, and a modulation order of 64 quadrature amplitude modulation (QAM) is 6.

During coding of a transport block, if a to-be-transmitted transport block is relatively large, that is, a quantity of input bits that can be supported by a channel code block is exceeded, the transport block needs to be divided into multiple code blocks (data blocks) for separately performing channel coding. An existing general block division method is: According to a maximum quantity L of input bits that is supported by a channel code block, L or less bits are intercepted continuously from a transport block, as a code block (data block), till a quantity of remaining bits is less than L. In a specific block division method, proper tuning also needs to be considered. For example, one or more cyclical redundancy check (CRC) check bits are padded to each code block (data block), and one or more padding bits are padded for matching a resource block size.

Because a polar code has a different structure from a convolutional code and a turbo code and its bit rate is related to a quantity of input bits, a fixed bit rate is unsuitable. Both a quantity of valid input bits and a quantity of valid output bits of the polar code are related to an encoder structure, and are associated with each other. Therefore, it is unsuitable to implement rate matching by puncturing only output bits.

In addition, the polar code has a different characteristic from the convolutional code and the turbo code. Transmission quality of input bits of the polar code is obviously different, and output bits of the polar code have different functions. Therefore, if an existing method is used to divide a transport block, a coding capability of the polar code cannot be fully used.

For example, when a size of a transport block size just exceeds a maximum quantity L of valid input bits that is supported by the polar code, the transport block is divided into a very large code block (data block) and a very small code block (data block). For transmission of the former, a large quantity of input ports with poor composite channels need to be used for the polar code. For the latter, a large quantity of input ports with very good composite channels need to be padded with invalid bits for the polar code, and therefore a capability can be fully used.

According to the coding method and apparatus, the base station, and the user equipment in the embodiments of the present invention, a capability of a polar code can be fully used, and polar coding performance and efficiency can be improved.

FIG. 1 is a flowchart of a coding method according to an embodiment of the present invention. The method in FIG. 1 is executed by a coding apparatus. The method includes:

101: Determine a quantity of polar codes used to code a to-be-transmitted data block and a block length of each polar code of the polar codes used to code the to-be-transmitted data block.

It should be understood that in this embodiment of the present invention, the block length of the polar code is equal to a total bit quantity of output bits that is of the polar code and that is before puncturing is performed. The block length N of the polar code may be depicted in a form of 2^n, where n is a positive integer.

Input bits of the polar code may include K information bits, T padding bits, and G constant bits. The information bit is also called a valid input bit, and the constant bit is also called a sleep bit. A value of T may be 0. A relationship among K, T, G, and N may be expressed by using the following formula:

$$N=K+T+G$$

In addition, the output bits of the polar code may include B coding bits and Z punctured bits. The coding bit is also called a valid output bit. A relationship among B, Z, and N may be expressed by using the following formula:

$$N=B+Z$$

102: Determine, according to a quantity of bits of the to-be-transmitted data block, the block length of each polar code of the polar codes used to code the to-be-transmitted data block, and an input composite channel characteristic corresponding to each input bit position in the polar code of the polar codes used to code the to-be-transmitted data block, allocation information of valid input bits of the polar code of the polar codes used to code the to-be-transmitted data block.

The quantity of polar codes used to code the to-be-transmitted data block is not less than two, and the quantity of bits of the to-be-transmitted data block exceeds a quantity of input bits that can be supported by any polar code of the polar codes used to code the to-be-transmitted data block.

It should be understood that allocation information of valid input bits of a polar code may include a quantity of valid input bits of the polar code and/or a position of a valid input bit of the polar code.

In this embodiment of the present invention, a total quantity of all valid input bits of the polar codes used to code the to-be-transmitted data block is equal to a size (a size in a unit of bits after conversion) of the to-be-transmitted data block.

In this embodiment of the present invention, when multiple polar codes are used to transmit data, an input bit position, corresponding to a relatively excellent input composite channel characteristic, of all input bit positions in the multiple polar codes is selected as an information bit position according to input composite channel characteristics corresponding to input bit positions in the polar codes, so that relatively excellent coding performance can be obtained.

Optionally, in an embodiment, the method further includes: receiving resource assignment information sent by a peer node. The resource assignment information carries the quantity of polar codes used to code the to-be-transmitted data block and block length information of each polar code of the polar codes used to code the to-be-transmitted data block. In this case, specific implementation of step 101 is: Determine, according to the resource assignment information, the quantity of polar codes used to code the to-be-transmitted data block and the block length information of the polar code of the polar codes used to code the to-be-transmitted data block. It should be understood that in this embodiment of the present invention, the peer node is a node that communicates with a device in which the coding apparatus is located. For example, when the coding apparatus is located in a base station, the peer node may be UE, a relay managed by a base station, a micro base station, or the like. When the coding apparatus is located in UE, the peer node may be a macro base station or micro base station of a cell to which the UE belongs, or the like.

Optionally, in another embodiment, specific implementation of step 101 is: Determine, according to the quantity of bits of the to-be-transmitted data block, the quantity of polar codes used to code the to-be-transmitted data block and the block length of each polar code of the polar codes used to code the to-be-transmitted data block. Specifically, the determining method is agreed in advance by the peer node and a local network node, or is specified by a protocol.

Optionally, in an embodiment, specific implementation of step 102 is: Allocate, one by one from excellent to poor according to the block length of each polar code of the polar codes used to code the to-be-transmitted data block and the input composite channel characteristic corresponding to each input bit position in the polar code of the polar codes used to code the to-be-transmitted data block, the valid input bits of the polar code of the polar codes used to code the to-be-transmitted data block, till all bits of the to-be-transmitted data block are allocated. Specifically, a total quantity of valid input bits of the to-be-transmitted data block is equal to the quantity of bits of the to-be-transmitted data block.

Optionally, in another embodiment, specific implementation of step 102 is: Allocate, one by one from poor to excellent according to the block length of each polar code of the polar codes used to code the to-be-transmitted data block and the input composite channel characteristic corresponding to each input bit position in the polar code of the polar codes used to code the to-be-transmitted data block, padding bits of the polar code of the polar codes used to code the to-be-transmitted data block, till all padding bits required for coding the to-be-transmitted data block are allocated. Specifically, a total quantity of padding bits required for coding the to-be-transmitted data block is determined by a sum of block lengths of the polar codes used to code the to-be-transmitted data block and the quantity of bits of the to-be-transmitted data block.

Optionally, in another embodiment, specific implementation of step 102 is: Allocate, according to the quantity of bits of the to-be-transmitted data block, the block length of each polar code of the polar codes used to code the to-be-transmitted data block, and the input composite channel characteristic corresponding to each input bit position in the polar code of the polar codes used to code the to-be-transmitted data block, a content bit of the to-be-transmitted data block to an input bit position, corresponding to a relatively excellent input composite channel characteristic, in the polar code used to code the to-be-transmitted data block, so that a difference between quantities of valid input bits of any two polar codes of the polar codes used to code the to-be-transmitted data block is less than a first predetermined threshold. A quantity of valid input bits of the polar code is a quantity of content bits allocated to the to-be-transmitted data block, and each polar code of the polar codes used to code the to-be-transmitted data block has a same block length.

Optionally, in another embodiment, specific implementation of step 102 is: Allocate, according to the quantity of bits of the to-be-transmitted data block, the block length of each polar code of the polar codes used to code the to-be-transmitted data block, and the input composite channel characteristic corresponding to each input bit position in the polar code of the polar codes used to code the to-be-transmitted data block, a padding bit required for coding the to-be-transmitted data block to an input bit position, corresponding to a relatively poor input composite channel characteristic, in the polar code used to code the to-be-transmitted data block, so that a difference between quantities of valid input bits of any two polar codes of the polar codes used to code the to-be-transmitted data block is less than a first predetermined threshold, and allocate a content bit of the to-be-transmitted data block to a remaining input bit position in the polar code of the polar codes used to code the to-be-transmitted data block. A quantity of valid input bits of the polar code is a quantity of content bits allocated to the to-be-transmitted data block, and each polar code of the polar codes used to code the to-be-transmitted data block has a same block length.

Preferably, the first predetermined threshold is equal to five times a highest modulation order of all modulation orders of the polar codes used to code the to-be-transmitted data block.

Optionally, the input composite channel characteristic includes at least one of the following: a capacity of an input composite channel, an error probability of an input composite channel, or a position indicator corresponding to an input composite channel.

Further, the position indicator corresponding to an input composite channel is obtained by means of calculation according to a parameter equation corresponding to a polar code of the input composite channel and an input bit position corresponding to the input composite channel; or the position indicator corresponding to an input composite channel is obtained by means of table lookup according to an indicator mapping table corresponding to a polar code of the input composite channel and an input bit position corresponding to the input composite channel. The indicator mapping table is used to indicate a mapping relationship between an input bit position in a polar code and a position indicator corresponding to an input composite channel.

Optionally, the method may further include step 103: Determine, according to a quantity of bits that can be transmitted by a physical transmission resource block of the to-be-transmitted data block, the block length of each polar code of the polar codes used to code the to-be-transmitted data block, and an output composite channel characteristic corresponding to each output bit position in the polar code of the polar codes used to code the to-be-transmitted data block, allocation information of valid output bits of the polar code of the polar codes used to code the to-be-transmitted data block.

In this embodiment of the present invention, when multiple polar codes are used to transmit data, an output bit position, corresponding to a relatively excellent output composite channel characteristic, of all output bit positions in the multiple polar codes is further selected as a coding bit position according to output composite channel characteristics corresponding to output bit positions in the polar codes, so that relatively excellent coding performance can be obtained.

Optionally, in an embodiment, specific implementation of step 103 is: Allocate, one by one from excellent to poor according to the block length of each polar code of the polar codes used to code the to-be-transmitted data block and the output composite channel characteristic corresponding to each output bit position in the polar code of the polar codes used to code the to-be-transmitted data block, the valid output bits of the polar code of the polar codes used to code the to-be-transmitted data block, till all bits that can be transmitted by the physical transmission resource block of the to-be-transmitted data block are allocated.

Optionally, in another embodiment, specific implementation of step 103 is: Allocate, one by one from poor to excellent according to the block length of each polar code of the polar codes used to code the to-be-transmitted data block and the output composite channel characteristic corresponding to each output bit position in the polar code of the polar codes used to code the to-be-transmitted data block, punctured bits of the polar code of the polar codes used to code the to-be-transmitted data block, till all punctured bits required for transmitting the to-be-transmitted data block are allocated. A quantity of the punctured bits required for transmitting the to-be-transmitted data block is equal to a sum of block lengths of the polar codes used to code the to-be-transmitted data block minus the quantity of bits that can be transmitted by the physical transmission resource block of the to-be-transmitted data block.

Optionally, in another embodiment, specific implementation of step 103 is: Allocate, according to the block length of each polar code of the polar codes used to code the to-be-transmitted data block and the output composite channel characteristic corresponding to each output bit position in the polar code of the polar codes used to code the to-be-transmitted data block, a bit that can be transmitted by the physical transmission resource block of the to-be-transmitted data block to an output bit position, corresponding to a relatively excellent output composite channel characteristic, in the polar code used to code the to-be-transmitted data block, so that a difference between quantities of valid output bits of any two polar codes of the polar codes used to code the to-be-transmitted data block is less than a second predetermined threshold. A quantity of valid output bits of the polar code is a quantity of remaining bits obtained after output bits of the polar code are punctured, and each polar code of the polar codes used to code the to-be-transmitted data blocks has a same block length.

Optionally, in another embodiment, specific implementation of step 103 is: Allocate, according to the block length of each polar code of the polar codes used to code the to-be-transmitted data block and the output composite channel characteristic corresponding to each output bit position in the polar code of the polar codes used to code the to-be-transmitted data block, a punctured bit required for coding the to-be-transmitted data block to an output bit position, corresponding to a relatively poor output composite channel characteristic, in the polar code used to code the to-be-transmitted data block, so that a difference between quantities of valid output bits of any two polar codes of the polar codes used to code the to-be-transmitted data block is less than a second predetermined threshold, and allocate a bit that can be transmitted by the physical transmission resource block of the to-be-transmitted data block to a remaining output bit position in the polar code of the polar codes used to code the to-be-transmitted data block. A quantity of valid output bits of the polar code is equal to a block length of the polar code minus a quantity of punctured bits of the polar code, and each polar code of the polar codes used to code the to-be-transmitted data blocks has a same block length.

Preferably, the second predetermined threshold is equal to six times a highest modulation order of all modulation orders of the polar codes used to code the to-be-transmitted data block.

Optionally, the output composite channel characteristic includes at least one of the following: a capacity of an output composite channel, an error probability of an output composite channel, or a position indicator corresponding to an output composite channel.

Further, the position indicator corresponding to an output composite channel is obtained by means of calculation according to a parameter equation corresponding to a polar code of the output composite channel and an output bit position corresponding to the output composite channel; or the position indicator corresponding to an output composite channel is obtained by means of table lookup according to an indicator mapping table corresponding to a polar code of the output composite channel and an output bit position corresponding to the output composite channel.

The following further describes the method in this embodiment of the present invention with reference to a specific embodiment.

Figure 3:
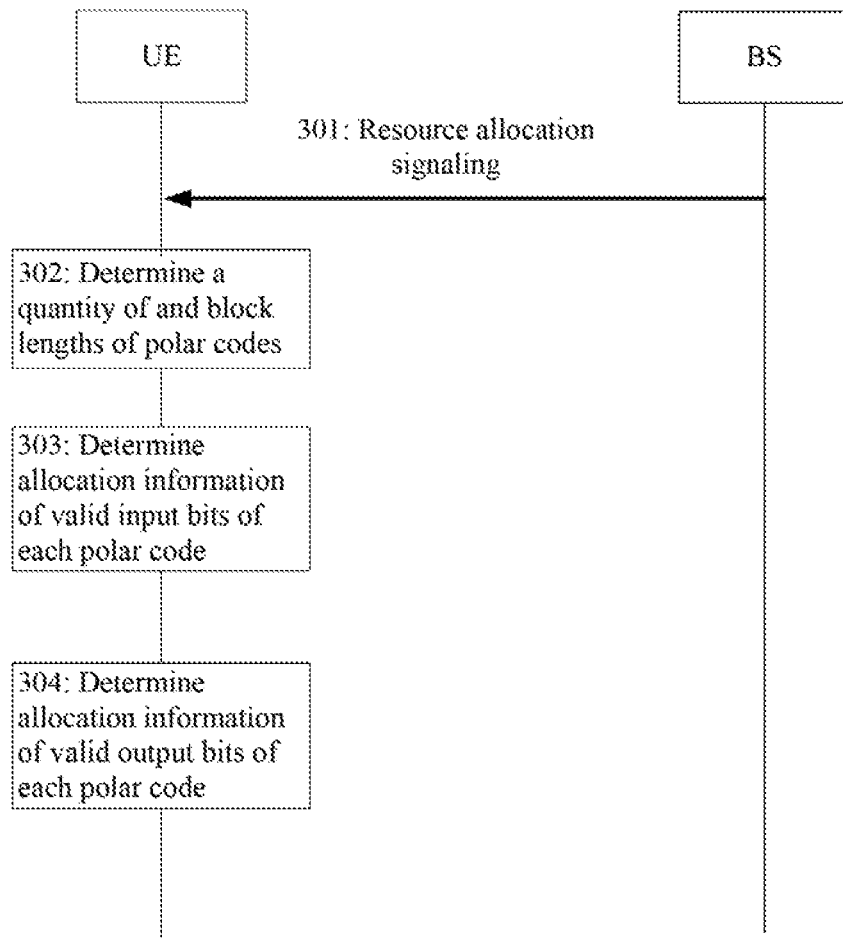
FIG. 3 is an interaction flowchart of a coding method according to an embodiment of the present invention.

FIG. 3 is an interaction flowchart of a method in which multiple polar codes are used to code and transmit data in this embodiment of the present invention. In FIG. 3, a BS specifies, by using a method of sending a message to UE, a quantity of polar codes used to code a to-be-transmitted data block and a block length of each polar code of the polar codes used to code the to-be-transmitted data block. In this embodiment of the present invention, the UE uses multiple polar codes to code the to-be-transmitted data block.

Certainly, it should be understood that in a specific application, the base station side may also use multiple polar codes to code the to-be-transmitted data block. In this embodiment of the present invention, the UE side is used as an example for description.

301: The BS sends resource assignment signaling.

The resource assignment signaling may be used to notify the UE of information such as a physical resource used for data transmission, the quantity of polar codes used to code the to-be-transmitted data block, the block length of each polar code of the polar codes used to code the to-be-transmitted data block, and a modulation and coding scheme (Modulation and Coding Scheme, MCS).

For example, specific resource assignment signaling may indicate that a physical resource includes four frequency domain subbands and ten time domain orthogonal frequency division multiplexing (Orthogonal Frequency Division Multiplexing, OFDM) symbols, 64 quadrature amplitude modulation (Quadrature Amplitude Modulation, QAM) is used for constellation modulation, a quantity of the polar codes is 2, and block lengths thereof are 16384 and 4096 respectively.

If a system configuration is that each subband includes five RBs, and it is agreed that each RB includes 12 subcarriers, the signaling indicates 4*5*12*10=2400 RE resources.

302: The UE determines a quantity of and block lengths of the polar codes.

The UE may determine, according to polar code information carried in the signaling, the quantity of polar codes used to code the to-be-transmitted data block and a block length of each polar code of the polar codes used to code the to-be-transmitted data block. According to the example of the resource assignment signaling in step 301, it may be determined that the quantity of polar codes is 2, and block lengths thereof are 16384 and 4096 respectively.

303: The UE determines allocation information of valid input bits of each polar code.

The UE may determine a transport block size (Transport Block Size, TBS) of the to-be-transmitted data block according to an MCS indication, a subband quantity indication, and the like in the signaling and by querying a preset mapping table. In this embodiment, it is assumed that TBS=10000.

It is assumed that according to a pre-agreement, 24-bit cyclic redundancy check (Cyclic Redundancy Check, CRC) needs to be added to each transport block (Transport Block, TB) and each data block separately, and a total quantity of to-be-transmitted bits is TBS+24+2*24=10072.

In addition, the UE may further determine, according to an input composite channel characteristic corresponding to each input bit position in each polar code, how to allocate valid input bits. A first parameter may be used to represent an input composite channel characteristic corresponding to an input bit position. The first parameter may be used to indicate input composite channel quality corresponding to an input bit position in a polar code. Specifically, the first parameter may include at least one of the following: a capacity of an input composite channel, an error probability of an input composite channel, or a position indicator corresponding to an input composite channel. The position indicator corresponding to an input composite channel is obtained by means of calculation according to a parameter equation corresponding to a polar code of the input composite channel and an input bit position corresponding to the input composite channel; or the position indicator corresponding to an input composite channel is obtained by means of table lookup according to an indicator mapping table corresponding to a polar code of the input composite channel and an input bit position corresponding to the input composite channel. The indicator mapping table is used to indicate a mapping relationship between an input bit position in a polar code and a position indicator corresponding to an input composite channel.

It should be understood that when content indicated by the first parameter is different, input composite channel characteristics indicated by the first parameter are also different. For example, when the first parameter is a capacity of an input composite channel of a polar code, a larger first parameter indicates better input composite channel quality. When the first parameter is an error probability of a polar code, a larger first parameter indicates worse input composite channel quality. When determining allocation information of valid input bits, the UE may sequence the valid input bits according to first parameters, and allocate a valid input bit to an input bit position corresponding to a relatively good input composite channel characteristic.

In this embodiment of the present invention, a position indicator corresponding to an output composite channel is used as a first parameter to indicate input composite channel quality. A larger position indicator corresponding to an output composite channel indicates better input composite channel quality.

Herein, it is assumed that the two parties the BS and the UE agree in advance that a preset mapping table is used to determine an input composite channel characteristic (a first parameter) corresponding to each input bit position in each polar code. A preset mapping table is a table for defining a block length of each polar code, and provides a first parameter corresponding to each input bit position in the polar code. If there are multiple different structure configurations for a block length of each polar code, the mapping table may provide a first parameter, corresponding to each input bit position, in each possible structure configuration of the block length of each polar code.

Accordingly, it is agreed that a first parameter corresponding to each input bit (assuming that there are 9000 bits) position in a polar code with a block length of 16384, and a first parameter corresponding to each input bit (assuming that there are 2000 bits) position in a polar code with a block length of 4096 are determined by means of table lookup. Then, from 11000 input bit positions, 10072 input bit positions corresponding to relatively large first parameters are selected as input bit positions to be used in transmission, or equivalently, 11000−10072=28 input bit positions corresponding to relatively small first parameters are selected as padding bit positions. It is assumed that among the 10072 input bit positions, 700 input bit positions belong to a polar code with a length of 16384, and 372 input bit positions belong to a polar code with a length of 4096. Accordingly, it may be determined that quantities of valid input bits of the two polar codes are respectively 700 and 372.

304: The UE determines allocation information of valid output bits of each polar code.

As described in step 303, the UE may determine, according to the resource assignment signaling, that a quantity of REs used in transmission is 2400. Further, a total quantity of output bits of all polar codes may be determined with reference to the MCS indication. In this embodiment, the signaling indicates 64 QAM, and therefore a total quantity of output bits of the two polar codes is 2400*6=14400.

Similarly, the UE may further determine, according to an output composite channel characteristic corresponding to each output bit position in each polar code, how to allocate valid output bits. A second parameter may be used to represent an output composite channel characteristic corresponding to an output bit position. The second parameter may be used to indicate output composite channel quality corresponding to an output bit position in a polar code. Specifically, the second parameter may include at least one of the following: a capacity of an output composite channel, an error probability of an output composite channel, or a position indicator corresponding to an output composite channel. The position indicator corresponding to an output composite channel is obtained by means of calculation according to a parameter equation corresponding to a polar code of the output composite channel and an output bit position corresponding to the output composite channel; or the position indicator corresponding to an output composite channel is obtained by means of table lookup according to an indicator mapping table corresponding to a polar code of the output composite channel and an output bit position corresponding to the output composite channel. The indicator mapping table is used to indicate a mapping relationship between an output bit position in a polar code and a position indicator corresponding to an output composite channel.

Herein, it is assumed that the two parties the BS and the UE agree in advance that a preset mapping table is used to determine an output composite channel characteristic (a second parameter) corresponding to each output bit position in each polar code. A preset mapping table is a table for defining a block length of each polar code, and provides a second parameter corresponding to each output bit position in the polar code. If there are multiple different structure configurations for a block length of each polar code, the mapping table may provide a second parameter, corresponding to each output bit position, in each possible structure configuration of the block length of each polar code.

Accordingly, it is agreed that a second parameter corresponding to each output bit (assuming that there are 10000 bits) position in a polar code with a length of 16384, and a second parameter corresponding to each output bit (assuming that there are 2500 bits) position in a polar code with a length of 4096 are determined by means of table lookup. Then, from 12500 output bit positions, 14400 output bit positions corresponding to relatively large second parameters are selected as positions for abstracting valid output bits of the polar code, or equivalently, 16384+4096−14400=6080 output bit positions corresponding to relatively small second parameters are selected as punctured bit positions. It is assumed that among the 14400 output bit positions, 11000 output bit positions belong to a polar code with a length of 16384, and 3400 output bit positions belong to a polar code with a length of 4096. Accordingly, it may be determined that quantities of valid output bits of the two polar codes are respectively 11000 and 3400.

Certainly, it should be understood that in this embodiment of the present invention, the BS and the UE may also determine, according to a total quantity of bits of the to-be-transmitted data block by using an algorithm agreed in advance, the quantity and the block lengths of polar codes used to code the to-be-transmitted data block.

Figure 4:
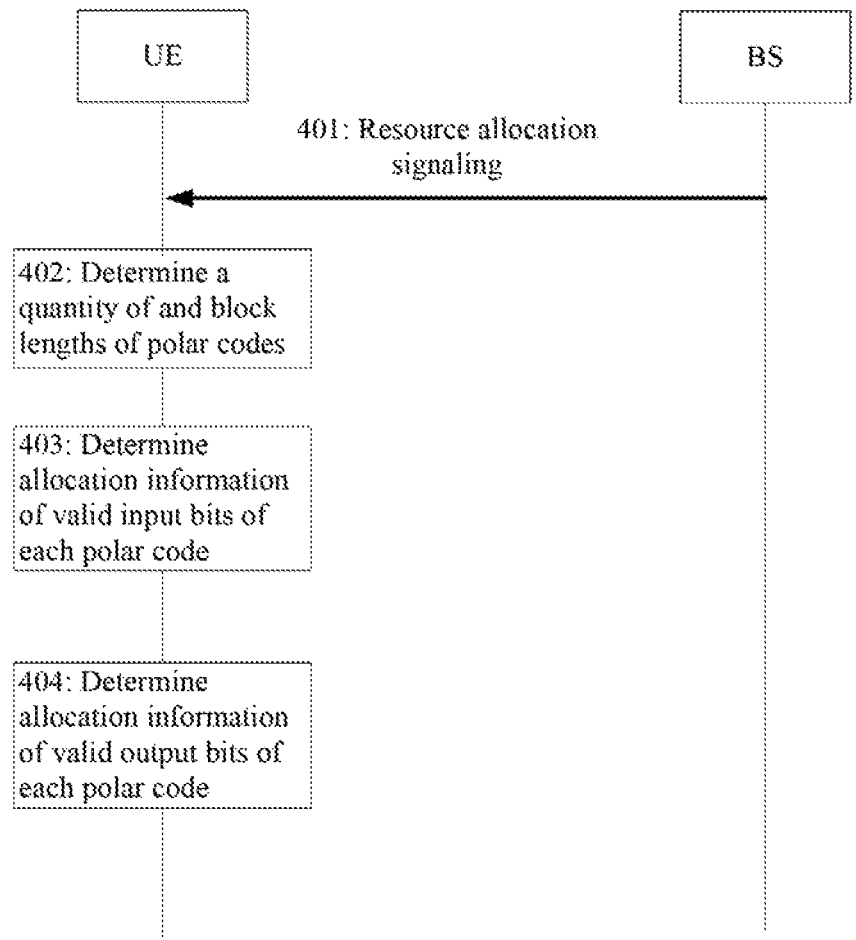
FIG. 4 is an interaction flowchart of another coding method according to an embodiment of the present invention.

FIG. 4 is an interaction flowchart of a method in which multiple polar codes are used to code and transmit data in this embodiment of the present invention. In FIG. 4, a BS specifies a quantity of polar codes and length information of the polar codes in a manner of agreeing a method in advance with UE. In this embodiment of the present invention, the UE uses multiple polar codes to code a to-be-transmitted data block.

Certainly, it should be understood that in a specific application, the base station side may also use multiple polar codes to code the to-be-transmitted data block. In this embodiment of the present invention, the UE side is used as an example for description.

401: The BS sends resource assignment signaling.

The resource assignment signaling may be used to notify the UE of information such as a physical resource used for data transmission and a modulation and coding scheme (Modulation and Coding Scheme, MCS).

For example, specific resource assignment signaling may indicate that a physical resource includes four frequency domain subbands, ten time domain orthogonal frequency division multiplexing (Orthogonal Frequency Division Multiplexing, OFDM) symbols, and 64 quadrature amplitude modulation (Quadrature Amplitude Modulation, QAM) is used for constellation modulation.

If a system configuration is that each subband includes five RBs, and it is agreed that each RB includes 12 subcarriers, the signaling indicates 4*5*12*10=2400 RE resources.

402: The UE determines a quantity of and block lengths of the polar codes.

The UE may learn a transport block size according to the resource assignment information by means of deduction. For example, a deduction method is that the two parties agree on a mapping table, and determine, by means of table lookup, a TBS according to a parameter such as an MCS indication and a physical resource indication. In this embodiment, it is assumed that TBS=10000.

It is agreed that a length of each CRC is 24, it is required that each code block size be CBS≤6000, and the two parties agree that an algorithm of determining the quantity of polar codes is N_polar ceil[(TBS+24)/(6000−24)]. Accordingly, it may be determined that the quantity of polar codes is 2, that is, there are two data blocks.

It is assumed that the two parties agree that a method of determining a block length of a polar code is: Each polar code has a same block length. To meet a minimum integral power of 2 that is required by a physical resource, a length of each polar code may be determined by using this method is $2^{\lceil log2(2400*6/N\_polar)\rceil}=8192$.

403: The UE determines allocation information of valid input bits of each polar code.

It is assumed that according to a pre-agreement, 24-bit CRC needs to be added to each TB and each data block separately, and a total quantity of to-be-transmitted bits is TBS+24+2*24=10072.

It is assumed that the two parties agree that a value of a first predetermined threshold is 50, all to-be-transmitted bits are approximately evenly allocated to each polar code, so that a difference between quantities of input bits of the polar codes is less than or equal to 50, and on a premise that a requirement for a quantity of input bits of the polar codes is met, a total quantity of padding bits is minimized. The requirement may be agreed by using a table or formula. A formula is used as an example herein. It is agreed that quantities of input bits of the polar codes may be 50*k, where k is a natural number that is less than or equal to 120. Accordingly, the two parties may agree that quantities of input bits of the two polar codes are both 5050, and a total quantity of padding bits is 28. It is easily agreed that when each polar code has a same block length and quantities of input bits are also equal, quantities of valid input bits of the polar code should also be equal. Accordingly, it may be determined that quantities of valid input bits of the two polar codes are both 5036, and quantities of padding bits of the two polar codes are both 14.

In this example, the quantities of input bits of the two polar codes are just equal. Actually, the quantities of input bits of the two polar codes may be unequal. For example, when TBS=10070, the total quantity of to-be-transmitted bits is 10142. According to the foregoing agreed method, the quantifies of input bits of the two polar codes are respectively 5050 and 5100, and the total quantity of padding bits is 8. It may be agreed that when the polar codes have a same block length and unequal quantities of input bits, a quantity of valid input bits of a relatively small polar code is equal to a quantity of input bits (excluding padding bits) of the polar code, and remaining valid input bits are evenly allocated to relatively large polar codes. Accordingly, it may be determined that the quantities of valid input bits of the two polar codes are respectively 5050 and 5092, and the quantities of padding bits of the two polar codes are respectively 0 and 8.

The two parties may agree that valid input bits are mapped to positions (5036 positions in this embodiment) with relatively good input composite channel quality, or equivalently, sleep bits and padding bits are mapped to positions (8192−5036=3156 positions in this embodiment) with relatively poor input composite channel quality.

According to an empirical formula, when a value of the first predetermined threshold is five times a maximum value of all modulation orders of the polar codes, relatively good coding performance can be obtained.

404: The UE determines allocation information of valid output bits of each polar code.

As described in step 403, the UE may determine, according to the resource assignment signaling, that a quantity of REs used in transmission is 2400. Further, a total quantity of output bits of all polar codes may be determined with reference to the MCS indication. In this embodiment, the signaling indicates 64 QAM, and therefore a total quantity of output bits of the two polar codes is 2400*6=14400.

It is assumed that the two parties agree that a value of a second predetermined threshold is 50, valid output bits are allocated to each polar code according to an allocation proportion of valid input bits. In this case, the two polar codes have a same quantity of valid input bits. Therefore, quantities of valid output bits of the polar codes are also the same, that is, are both 7200 (50*144), and quantities of punctured bits of the polar codes are both 8192−7200=992.

The two parties may agree that valid output bits are mapped to positions (7200 positions in this embodiment) with relatively good output composite channel quality, or equivalently, punctured bits are mapped to positions (992 positions in this embodiment) with relatively poor output composite channel quality.

According to an empirical formula, when a value of the second predetermined threshold is six times a maximum value of all modulation orders of the polar codes, relatively good coding performance can be obtained.

Certainly, it should be understood that in this embodiment of the present invention, the BS may also specify the quantity and the block lengths of the polar codes by sending resource assignment signaling to the UE.

In addition, it should be understood that in FIG. 3 and FIG. 4, a method of determining the allocation information of valid input bits may be independent of a method of determining the allocation information of valid output bits.

For example, the allocation information of valid input bits is determined by using a method shown in step 303 in FIG. 3 or a method shown in step 403 in FIG. 4, and the allocation information of valid output bits may be determined by referring to a solution in the prior art. In this way, coding input performance of the polar codes can be improved to a specific extent.

For another example, the allocation information of valid input bits may be determined by referring to a solution in the prior art, and the allocation information of valid output bits is determined by using a method shown in step 304 in FIG. 3 or a method shown in step 404 in FIG. 4. In this way, coding output performance of the polar codes can be improved to a specific extent.

Figure 5:
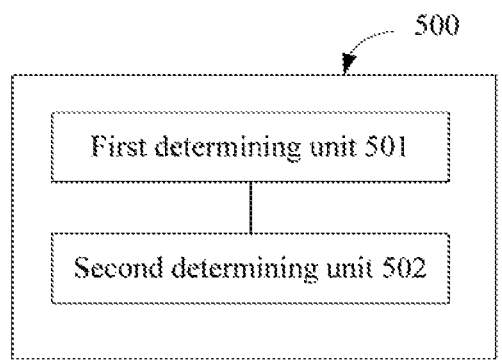
FIG. 5 is a schematic structural diagram of a coding apparatus according to an embodiment of the present invention.

FIG. 5 is a schematic structural diagram of a coding apparatus 500 according to an embodiment of the present invention. As shown in FIG. 5, the coding apparatus 500 may include a first determining unit 501 and a second determining unit 502.

The first determining unit 501 is configured to determine a quantity of polar codes used to code a to-be-transmitted data block and a block length of each polar code of the polar codes used to code the to-be-transmitted data block.

The second determining unit 502 is configured to determine, according to a quantity of bits of the to-be-transmitted data block, the block length of each polar code of the polar codes used to code the to-be-transmitted data block, and an input composite channel characteristic corresponding to each input bit position in the polar code of the polar codes used to code the to-be-transmitted data block, allocation information of valid input bits of the polar code of the polar codes used to code the to-be-transmitted data block.

The quantity of polar codes used to code the to-be-transmitted data block is not less than two, and the quantity of bits of the to-be-transmitted data block exceeds a quantity of input bits that can be supported by any polar code of the polar codes used to code the to-be-transmitted data block.

In this embodiment of the present invention, when the coding apparatus 500 uses multiple polar codes to transmit data, an input bit position, corresponding to a relatively excellent input composite channel characteristic, of all input bit positions in the multiple polar codes is selected as an information bit position according to input composite channel characteristics corresponding to input bit positions in the polar codes, so that relatively excellent coding performance can be obtained.

It should be understood that in a specific application, the coding apparatus 500 may be located in a macro base station, a micro base station, a relay device, or user equipment, and is configured to implement a coding operation for transmitting a data block.

Figure 6:
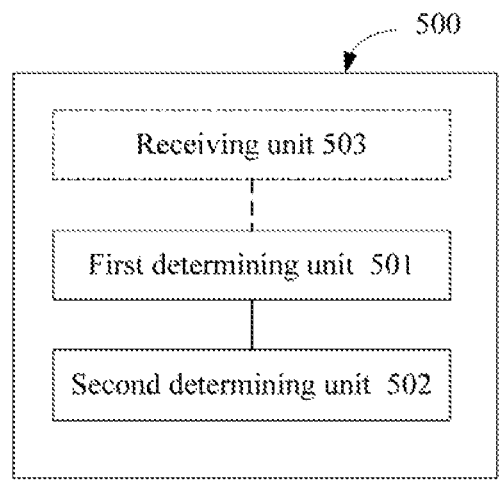
FIG. 6 is a schematic structural diagram of another coding apparatus according to an embodiment of the present invention.

Optionally, in an embodiment, as shown in FIG. 6, the coding apparatus 500 further includes a receiving unit 503, configured to receive resource assignment information sent by a peer node. The resource assignment information carries the quantity of polar codes used to code the to-be-transmitted data block and block length information of each polar code of the polar codes used to code the to-be-transmitted data block. The first determining unit 501 is specifically configured to determine, according to the resource assignment information, the quantity of polar codes used to code the to-be-transmitted data block and the block length information of the polar code of the polar codes used to code the to-be-transmitted data block.

Optionally, in another embodiment, the first determining unit 501 is specifically configured to determine, according to the quantity of bits of the to-be-transmitted data block, the quantity of polar codes used to code the to-be-transmitted data block and the block length of each polar code of the polar codes used to code the to-be-transmitted data block.

Optionally, in an embodiment, the second determining unit 502 is specifically configured to allocate, one by one from excellent to poor according to the block length of each polar code of the polar codes used to code the to-be-transmitted data block and the input composite channel characteristic corresponding to each input bit position in the polar code of the polar codes used to code the to-be-transmitted data block, valid input bits of the polar code of the polar codes used to code the to-be-transmitted data block, till all bits of the to-be-transmitted data block are allocated. Specifically, a total quantity of valid input bits of the to-be-transmitted data block is equal to the quantity of bits of the to-be-transmitted data block.

Optionally, in another embodiment, the second determining unit 502 is specifically configured to allocate, one by one from poor to excellent according to the block length of each polar code of the polar codes used to code the to-be-transmitted data block and the input composite channel characteristic corresponding to each input bit position in the polar code of the polar codes used to code the to-be-transmitted data block, padding bits of the polar code of the polar codes used to code the to-be-transmitted data block, till all padding bits required for coding the to-be-transmitted data block are allocated. Specifically, a total quantity of padding bits required for coding the to-be-transmitted data block is determined by a sum of block lengths of the polar codes used to code the to-be-transmitted data block and the quantity of bits of the to-be-transmitted data block.

Optionally, in another embodiment, the second determining unit 502 is specifically configured to allocate, according to the quantity of bits of the to-be-transmitted data block, the block length of each polar code of the polar codes used to code the to-be-transmitted data block, and the input composite channel characteristic corresponding to each input bit position in the polar code of the polar codes used to code the to-be-transmitted data block, a content bit of the to-be-transmitted data block to an input bit position, corresponding to a relatively excellent input composite channel characteristic, in the polar code used to code the to-be-transmitted data block, so that a difference between quantities of valid input bits of any two polar codes of the polar codes used to code the to-be-transmitted data block is less than a first predetermined threshold. A quantity of valid input bits of the polar code is a quantity of content bits allocated to the to-be-transmitted data block, and each polar code of the polar codes used to code the to-be-transmitted data block has a same block length. Optionally, in another embodiment, the second determining unit 502 is specifically configured to allocate, according to the quantity of bits of the to-be-transmitted data block, the block length of each polar code of the polar codes used to code the to-be-transmitted data block, and the input composite channel characteristic corresponding to each input bit position in the polar code of the polar codes used to code the to-be-transmitted data block, a padding bit required for coding the to-be-transmitted data block to an input bit position, corresponding to a relatively poor input composite channel characteristic, in the polar code used to code the to-be-transmitted data block, so that a difference between quantities of valid input bits of any two polar codes of the polar codes used to code the to-be-transmitted data block is less than a first predetermined threshold, and allocate a content bit of the to-be-transmitted data block to a remaining input bit position in the polar code of the polar codes used to code the to-be-transmitted data block. A quantity of valid input bits of the polar code is a quantity of content bits allocated to the to-be-transmitted data block, and each polar code of the polar codes used to code the to-be-transmitted data block has a same block length.

Preferably, the first predetermined threshold is equal to five times a highest modulation order of all modulation orders of the polar codes used to code the to-be-transmitted data block.

Optionally, the input composite channel characteristic includes at least one of the following: a capacity of an input composite channel, an error probability of an input composite channel, or a position indicator corresponding to an input composite channel.

Further, the position indicator corresponding to an input composite channel is obtained by means of calculation according to a parameter equation corresponding to a polar code of the input composite channel and an input bit position corresponding to the input composite channel; or the position indicator corresponding to an input composite channel is obtained by means of table lookup according to an indicator mapping table corresponding to a polar code of the input composite channel and an input bit position corresponding to the input composite channel. The indicator mapping table is used to indicate a mapping relationship between an input bit position in a polar code and a position indicator corresponding to an input composite channel.

Figure 7:
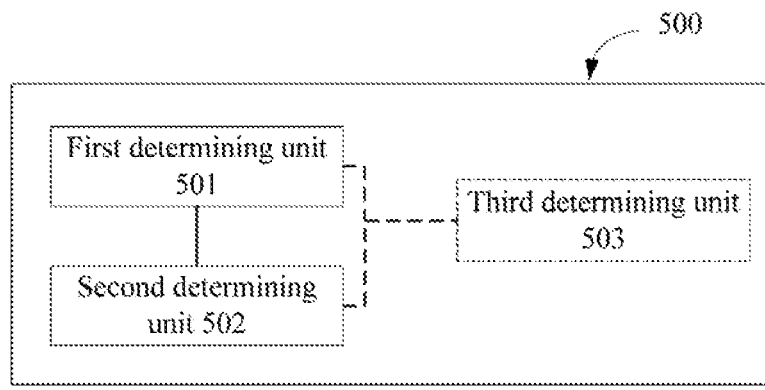
FIG. 7 is a schematic structural diagram of another coding apparatus according to an embodiment of the present invention.

Optionally, as shown in FIG. 7, the coding apparatus 500 may further include a third determining unit 503, configured to determine, according to a quantity of bits that can be transmitted by a physical transmission resource block of the to-be-transmitted data block, the block length of each polar code of the polar codes used to code the to-be-transmitted data block, and an output composite channel characteristic corresponding to each output bit position in the polar code of the polar codes used to code the to-be-transmitted data block, allocation information of valid output bits of the polar code of the polar codes used to code the to-be-transmitted data block.

In this embodiment of the present invention, when using multiple polar codes to transmit data, the coding apparatus 500 further selects an output bit position, corresponding to a relatively excellent output composite channel characteristic, of all output bit positions in the multiple polar codes as a coding bit position according to output composite channel characteristics corresponding to output bit positions in the polar codes, so as to obtain relatively excellent coding performance.

Optionally, in an embodiment, the third determining unit 503 is specifically configured to allocate, one by one from excellent to poor according to the block length of each polar code of the polar codes used to code the to-be-transmitted data block and the output composite channel characteristic corresponding to each output bit position in the polar code of the polar codes used to code the to-be-transmitted data block, the valid output bits of the polar code of the polar codes used to code the to-be-transmitted data block, till all bits that can be transmitted by the physical transmission resource block of the to-be-transmitted data block are allocated.

Optionally, in another embodiment, the third determining unit 503 is specifically configured to allocate, one by one from poor to excellent according to the block length of each polar code of the polar codes used to code the to-be-transmitted data block and the output composite channel characteristic corresponding to each output bit position in the polar code of the polar codes used to code the to-be-transmitted data block, punctured bits of the polar code of the polar codes used to code the to-be-transmitted data block, till all punctured bits required for transmitting the to-be-transmitted data block are allocated. A quantity of the punctured bits required for transmitting the to-be-transmitted data block is equal to a sum of block lengths of the polar codes used to code the to-be-transmitted data block minus the quantity of bits that can be transmitted by the physical transmission resource block of the to-be-transmitted data block.

Optionally, in another embodiment, the third determining unit 503 is specifically configured to allocate, according to the block length of each polar code of the polar codes used to code the to-be-transmitted data block and the output composite channel characteristic corresponding to each output bit position in the polar code of the polar codes used to code the to-be-transmitted data block, a bit that can be transmitted by the physical transmission resource block of the to-be-transmitted data block to an output bit position, corresponding to a relatively excellent output composite channel characteristic, in the polar code used to code the to-be-transmitted data block, so that a difference between quantities of valid output bits of any two polar codes of the polar codes used to code the to-be-transmitted data block is less than a second predetermined threshold. A quantity of valid output bits of the polar code is a quantity of remaining bits obtained after output bits of the polar code are punctured, and each polar code of the polar codes used to code the to-be-transmitted data blocks has a same block length.

Optionally, in another embodiment, the third determining unit 503 is specifically configured to allocate, according to the block length of each polar code of the polar codes used to code the to-be-transmitted data block and the output composite channel characteristic corresponding to each output bit position in the polar code of the polar codes used to code the to-be-transmitted data block, a punctured bit required for coding the to-be-transmitted data block to an output bit position, corresponding to a relatively poor output composite channel characteristic, in the polar code used to code the to-be-transmitted data block, so that a difference between quantities of valid output bits of any two polar codes of the polar codes used to code the to-be-transmitted data block is less than a second predetermined threshold, and allocate a bit that can be transmitted by the physical transmission resource block of the to-be-transmitted data block to a remaining output bit position in the polar code of the polar codes used to code the to-be-transmitted data block. A quantity of valid output bits of the polar code is equal to a block length of the polar code minus a quantity of punctured bits of the polar code, and each polar code of the polar codes used to code the to-be-transmitted data blocks has a same block length.

Preferably, the second predetermined threshold is equal to six times a highest modulation order of all modulation orders of the polar codes used to code the to-be-transmitted data block.

Optionally, the output composite channel characteristic includes at least one of the following: a capacity of an output composite channel, an error probability of an output composite channel, or a position indicator corresponding to an output composite channel.

Further, the position indicator corresponding to an output composite channel is obtained by means of calculation according to a parameter equation corresponding to a polar code of the output composite channel and an output bit position corresponding to the output composite channel; or the position indicator corresponding to an output composite channel is obtained by means of table lookup according to an indicator mapping table corresponding to a polar code of the output composite channel and an output bit position corresponding to the output composite channel.

Figure 2:
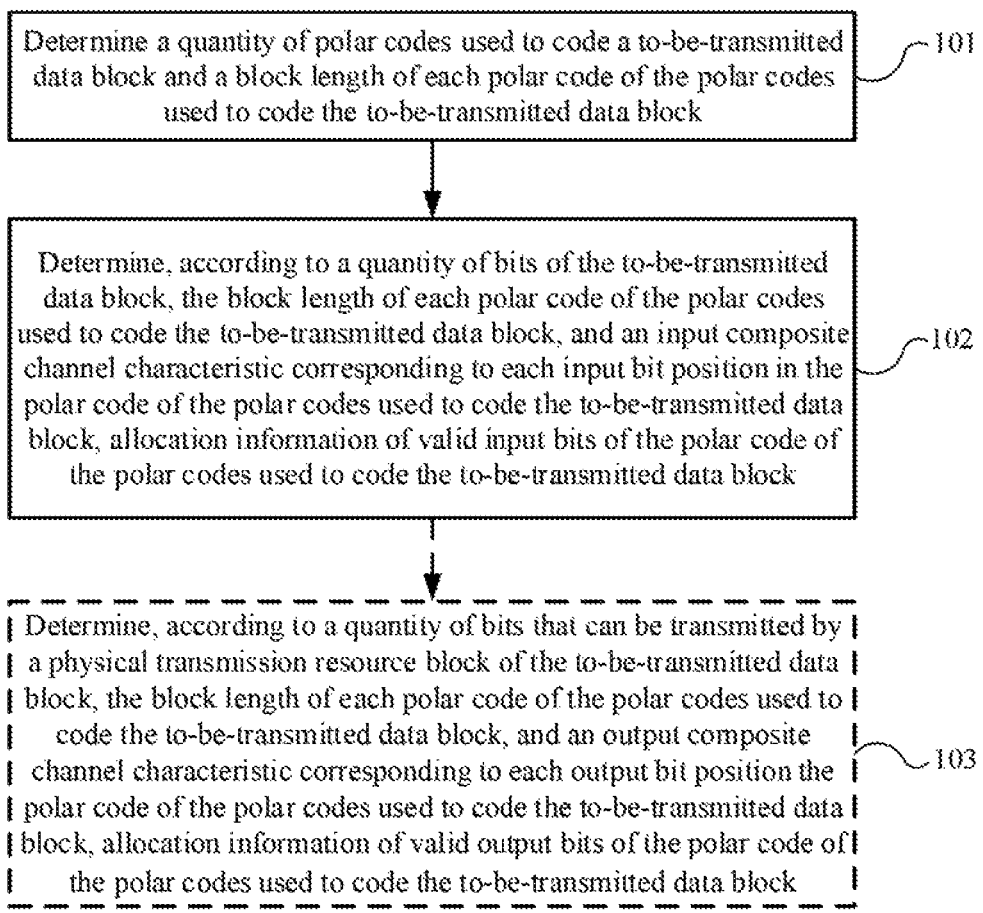
FIG. 2 is a flowchart of another coding method according to an embodiment of the present invention.

The coding apparatus 500 may further execute the method in FIG. 1 or FIG. 2, and implement the coding apparatus function executed by the UE in the embodiment shown in FIG. 3 or FIG. 4. This is not described in this embodiment of the present invention.

Figure 8:
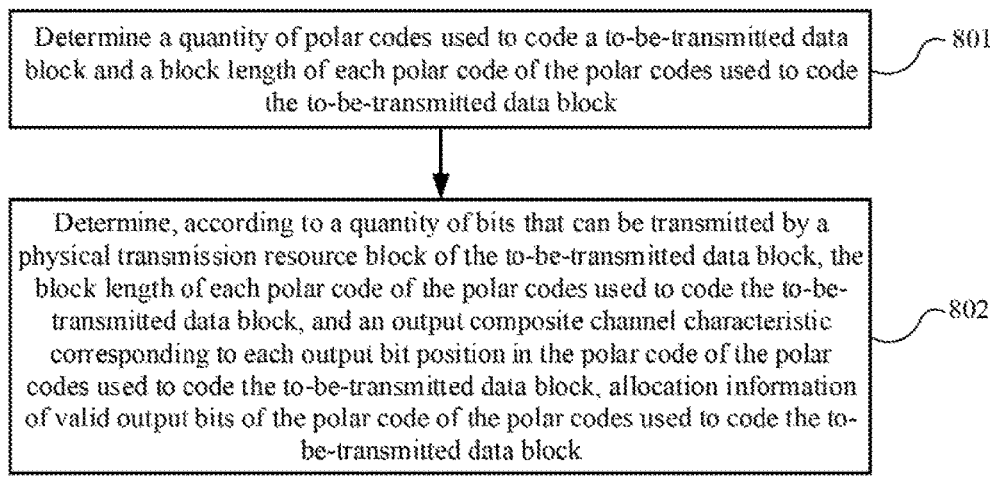
FIG. 8 is a flowchart of another coding method according to an embodiment of the present invention.

FIG. 8 is a flowchart of a coding method according to an embodiment of the present invention. The method in FIG. 8 is executed by a coding apparatus. The method includes:

801: Determine a quantity of polar codes used to code a to-be-transmitted data block and a block length of each polar code of the polar codes used to code the to-be-transmitted data block.

It should be understood that in this embodiment of the present invention, the block length of the polar code is equal to a total bit quantity of output bits that is of the polar code and that is before puncturing is performed. The block length N of the polar code may be depicted in a form of $2^n$, where n is a positive integer.

Input bits of the polar code may include K information bits, T padding bits, and G constant bits. The information bit is also called a valid input bit, and the constant bit is also called a sleep bit. A value of T may be 0. A relationship among K, T, G, and N may be expressed by using the following formula:

$$N=K+T+G$$

In addition, the output bits of the polar code may include B coding bits and Z punctured bits. The coding bit is also called a valid output bit. A relationship among B, Z, and N may be expressed by using the following formula:

$$N=B+Z$$

802: Determine, according to a quantity of bits that can be transmitted by a physical transmission resource block of the to-be-transmitted data block, the block length of each polar code of the polar codes used to code the to-be-transmitted data block, and an output composite channel characteristic corresponding to each output bit position in the polar code of the polar codes used to code the to-be-transmitted data block, allocation information of valid output bits of the polar code of the polar codes used to code the to-be-transmitted data block.

The quantity of polar codes used to code the to-be-transmitted data block is not less than two, and a quantity of bits of the to-be-transmitted data block exceeds a quantity of input bits that can be supported by any polar code of the polar codes used to code the to-be-transmitted data block.

Certainly, it should be understood that before the allocation information of valid output bits of the polar code is determined, allocation information of valid input bits of each polar code of the polar codes used to code the to-be-transmitted data block should also be determined. For specific implementation of determining the allocation information of valid input bits, reference may be made to a method of determining allocation information of valid input bits of a polar code in the prior art, or reference may be made to step 102 in FIG. 1. This is not described in this embodiment of the present invention.

In this embodiment of the present invention, when multiple polar codes are used to transmit data, an output bit position, corresponding to a relatively excellent output composite channel characteristic, of all output bit positions in the multiple polar codes is further selected as a coding bit position according to output composite channel characteristics corresponding to output bit positions in the polar codes, so that relatively excellent coding performance can be obtained.

Optionally, in an embodiment, the method further includes: receiving resource assignment information sent by a peer node. The resource assignment information carries the quantity of polar codes used to code the to-be-transmitted data block and block length information of each polar code of the polar codes used to code the to-be-transmitted data block. In this case, specific implementation of step 801 is: Determine, according to the resource assignment information, the quantity of polar codes used to code the to-be-transmitted data block and the block length information of the polar code of the polar codes used to code the to-be-transmitted data block. It should be understood that in this embodiment of the present invention, the peer node is a node that communicates with a device in which the coding apparatus is located. For example, when the coding apparatus is located in a base station, the peer node may be UE, a relay managed by a base station, a micro base station, or the like. When the coding apparatus is located in UE, the peer node may be a macro base station or micro base station of a cell to which the UE belongs, or the like.

Optionally, in another embodiment, specific implementation of step 801 is: Determine, according to the quantity of bits of the to-be-transmitted data block, the quantity of polar codes used to code the to-be-transmitted data block and the block length of each polar code of the polar codes used to code the to-be-transmitted data block. Specifically, the determining method is agreed in advance by the peer node and a local network node, or is specified by a protocol.

Optionally, in an embodiment, specific implementation of step 802 is: Allocate, one by one from excellent to poor according to the block length of each polar code of the polar codes used to code the to-be-transmitted data block and the output composite channel characteristic corresponding to each output bit position in the polar code of the polar codes used to code the to-be-transmitted data block, the valid output bits of the polar code of the polar codes used to code the to-be-transmitted data block, till all bits that can be transmitted by the physical transmission resource block of the to-be-transmitted data block are allocated.

Optionally, in another embodiment, specific implementation of step 802 is: Allocate, one by one from poor to excellent according to the block length of each polar code of the polar codes used to code the to-be-transmitted data block and the output composite channel characteristic corresponding to each output bit position in the polar code of the polar codes used to code the to-be-transmitted data block, punctured bits of the polar code of the polar codes used to code the to-be-transmitted data block, till all punctured bits required for transmitting the to-be-transmitted data block are allocated. A quantity of the punctured bits required for transmitting the to-be-transmitted data block is equal to a sum of block lengths of the polar codes used to code the to-be-transmitted data block minus the quantity of bits that can be transmitted by the physical transmission resource block of the to-be-transmitted data block.

Optionally, in another embodiment, specific implementation of step 802 is: Allocate, according to the block length of each polar code of the polar codes used to code the to-be-transmitted data block and the output composite channel characteristic corresponding to each output bit position in the polar code of the polar codes used to code the to-be-transmitted data block, a bit that can be transmitted by the physical transmission resource block of the to-be-transmitted data block to an output bit position, corresponding to a relatively excellent output composite channel characteristic, in the polar code used to code the to-be-transmitted data block, so that a difference between quantities of valid output bits of any two polar codes of the polar codes used to code the to-be-transmitted data block is less than a second predetermined threshold. A quantity of valid output bits of the polar code is a quantity of remaining bits obtained after output bits of the polar code are punctured, and each polar code of the polar codes used to code the to-be-transmitted data blocks has a same block length.

Optionally, in another embodiment, specific implementation of step 802 is: Allocate, according to the block length of each polar code of the polar codes used to code the to-be-transmitted data block and the output composite channel characteristic corresponding to each output bit position in the polar code of the polar codes used to code the to-be-transmitted data block, a punctured bit required for coding the to-be-transmitted data block to an output bit position, corresponding to a relatively poor output composite channel characteristic, in the polar code used to code the to-be-transmitted data block, so that a difference between quantities of valid output bits of any two polar codes of the polar codes used to code the to-be-transmitted data block is less than a second predetermined threshold, and allocate a bit that can be transmitted by the physical transmission resource block of the to-be-transmitted data block to a remaining output bit position in the polar code of the polar codes used to code the to-be-transmitted data block. A quantity of valid output bits of the polar code is equal to a block length of the polar code minus a quantity of punctured bits of the polar code, and each polar code of the polar codes used to code the to-be-transmitted data blocks has a same block length.

Preferably, the second predetermined threshold is equal to six times a highest modulation order of all modulation orders of the polar codes used to code the to-be-transmitted data block.

Optionally, the output composite channel characteristic includes at least one of the following: a capacity of an output composite channel, an error probability of an output composite channel, or a position indicator corresponding to an output composite channel.

Further, the position indicator corresponding to an output composite channel is obtained by means of calculation according to a parameter equation corresponding to a polar code of the output composite channel and an output bit position corresponding to the output composite channel; or the position indicator corresponding to an output composite channel is obtained by means of table lookup according to an indicator mapping table corresponding to a polar code of the output composite channel and an output bit position corresponding to the output composite channel.

For specific implementation of FIG. 8, reference may be made to the method that is executed by the UE and that is in FIG. 3 or FIG. 4. This is not described in this embodiment of the present invention.

Figure 9:
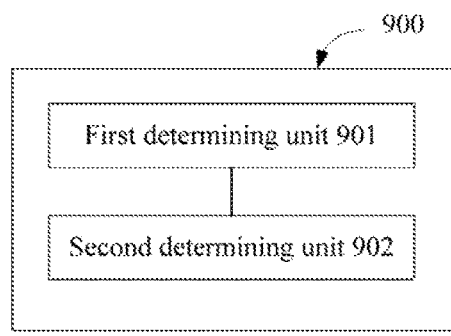
FIG. 9 is a schematic structural diagram of another coding apparatus according to an embodiment of the present invention.

FIG. 9 is a schematic structural diagram of a coding apparatus 900 according to an embodiment of the present invention. As shown in FIG. 9, the coding apparatus 900 may include a first determining unit 901 and a second determining unit 902.

The first determining unit 901 is configured to determine a quantity of polar codes used to code a to-be-transmitted data block and a block length of each polar code of the polar codes used to code the to-be-transmitted data block.

The second determining unit 902 is configured to determine, according to a quantity of bits that can be transmitted by a physical transmission resource block of the to-be-transmitted data block, the block length of each polar code of the polar codes used to code the to-be-transmitted data block, and an output composite channel characteristic corresponding to each output bit position in the polar code of the polar codes used to code the to-be-transmitted data block, allocation information of valid Output bits of the polar code of the polar codes used to code the to-be-transmitted data block.

In this embodiment of the present invention, when using multiple polar codes to transmit data, the coding apparatus 900 further selects an output bit position, corresponding to a relatively excellent output composite channel characteristic, of all output bit positions in the multiple polar codes as a coding bit position according to output composite channel characteristics corresponding to output bit positions in the polar codes, so as to obtain relatively excellent coding performance.

It should be understood that in a specific application, the coding apparatus 900 may be located in a macro base station, a micro base station, a relay device, or user equipment, and is configured to implement a coding operation for transmitting a data block.

Figure 10:
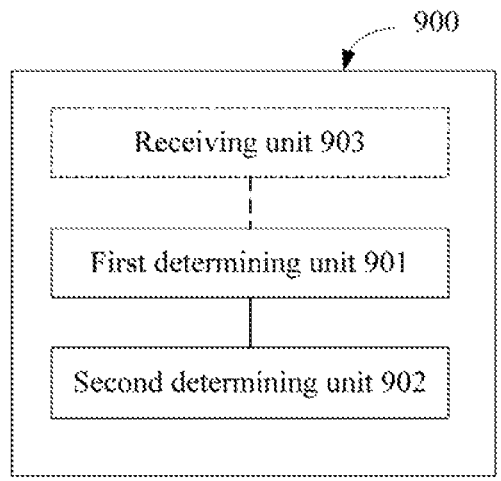
FIG. 10 is a schematic structural diagram of another coding apparatus according to an embodiment of the present invention.

Optionally, in an embodiment, as shown in FIG. 10, the coding apparatus further includes a receiving unit 903, configured to receive resource assignment information sent by a peer node. The resource assignment information carries the quantity of polar codes used to code the to-be-transmitted data block and block length information of each polar code of the polar codes used to code the to-be-transmitted data block. The first determining unit 901 is specifically configured to determine, according to the resource assignment information, the quantity of polar codes used to code the to-be-transmitted data block and the block length information of the polar code of the polar codes used to code the to-be-transmitted data block.

Optionally, in another embodiment, the first determining unit 901 is specifically configured to determine, according to a quantity of bits of the to-be-transmitted data block, the quantity of polar codes used to code the to-be-transmitted data block and the block length of each polar code of the polar codes used to code the to-be-transmitted data block.

Optionally, in an embodiment, the second determining unit 902 is specifically configured to allocate, one by one from excellent to poor according to the block length of each polar code of the polar codes used to code the to-be-transmitted data block and the output composite channel characteristic corresponding to each output bit position in the polar code of the polar codes used to code the to-be-transmitted data block, the valid output bits of the polar code of the polar codes used to code the to-be-transmitted data block, till all bits that can be transmitted by the physical transmission resource block of the to-be-transmitted data block are allocated.

Optionally, in another embodiment, the second determining unit 902 is specifically configured to allocate, one by one from poor to excellent according to the block length of each polar code of the polar codes used to code the to-be-transmitted data block and the output composite channel characteristic corresponding to each output bit position in the polar code of the polar codes used to code the to-be-transmitted data block, punctured bits of the polar code of the polar codes used to code the to-be-transmitted data block, till all punctured bits required for transmitting the to-be-transmitted data block are allocated. A quantity of the punctured bits required for transmitting the to-be-transmitted data block is equal to a sum of block lengths of the polar codes used to code the to-be-transmitted data block minus the quantity of bits that can be transmitted by the physical transmission resource block of the to-be-transmitted data block.

Optionally, in another embodiment, the second determining unit 902 is specifically configured to allocate, according to the block length of each polar code of the polar codes used to code the to-be-transmitted data block and the output composite channel characteristic corresponding to each output bit position in the polar code of the polar codes used to code the to-be-transmitted data block, a bit that can be transmitted by the physical transmission resource block of the to-be-transmitted data block to an output bit position, corresponding to a relatively excellent output composite channel characteristic, in the polar code used to code the to-be-transmitted data block, so that a difference between quantities of valid output bits of any two polar codes of the polar codes used to code the to-be-transmitted data block is less than a second predetermined threshold. A quantity of valid output bits of the polar code is a quantity of remaining bits obtained after output bits of the polar code are punctured, and each polar code of the polar codes used to code the to-be-transmitted data blocks has a same block length.

Optionally, in another embodiment, the second determining unit 902 is specifically configured to allocate, according to the block length of each polar code of the polar codes used to code the to-be-transmitted data block and the output composite channel characteristic corresponding to each output bit position in the polar code of the polar codes used to code the to-be-transmitted data block, a punctured bit required for coding the to-be-transmitted data block to an output bit position, corresponding to a relatively poor output composite channel characteristic, in the polar code used to code the to-be-transmitted data block, so that a difference between quantities of valid output bits of any two polar codes of the polar codes used to code the to-be-transmitted data block is less than a second predetermined threshold, and allocate a bit that can be transmitted by the physical transmission resource block of the to-be-transmitted data block to a remaining output bit position in the polar code of the polar codes used to code the to-be-transmitted data block. A quantity of valid output bits of the polar code is equal to a block length of the polar code minus a quantity of punctured bits of the polar code, and each polar code of the polar codes used to code the to-be-transmitted data blocks has a same block length.

Preferably, the second predetermined threshold is equal to six times a highest modulation order of all modulation orders of the polar codes used to code the to-be-transmitted data block.

Optionally, the output composite channel characteristic includes at least one of the following: a capacity of an output composite channel, an error probability of an output composite channel, or a position indicator corresponding to an output composite channel.

Further, the position indicator corresponding to an output composite channel is obtained by means of calculation according to a parameter equation corresponding to a polar code of the output composite channel and an output bit position corresponding to the output composite channel; or the position indicator corresponding to an output composite channel is obtained by means of table lookup according to an indicator mapping table corresponding to a polar code of the output composite channel and an output bit position corresponding to the output composite channel.

The coding apparatus 900 may further execute the method in FIG. 8, and implement the function, of allocating the valid output bits of the polar code by the UE, in the embodiment shown in FIG. 3 or FIG. 4. This is not described in this embodiment of the present invention.

Figure 11:
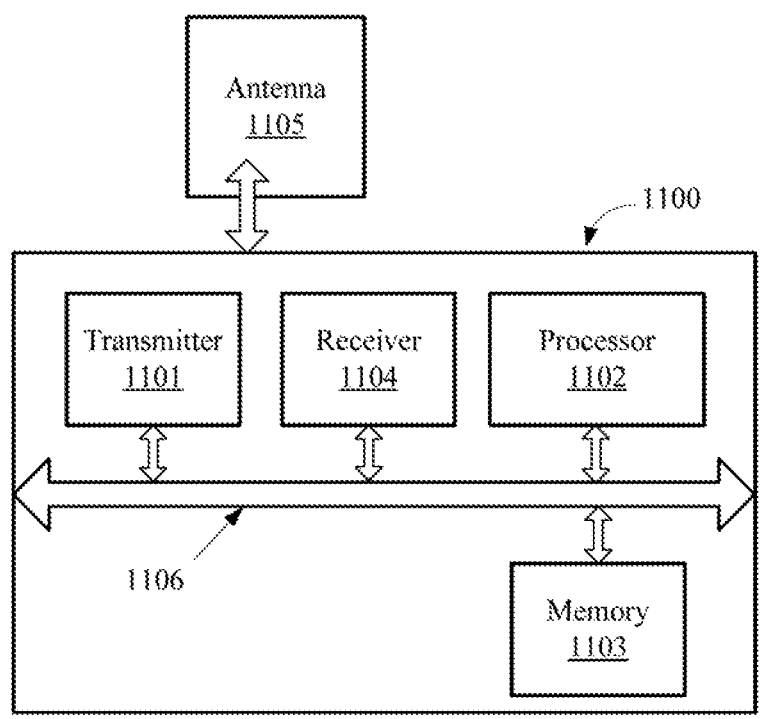
FIG. 11 is a schematic structural diagram of another coding apparatus according to an embodiment of the present invention.

FIG. 11 is a schematic structural diagram of a coding apparatus 1100 according to an embodiment of the present invention. The coding apparatus 1100 may include a transmitter 1101, a receiver 1104, a processor 1102, and a memory 1103.

The transmitter 1101, the receiver 1104, the processor 1102, and the memory 1103 are connected to each other by using a bus 1106 system. The bus 1106 may be an ISA bus, a PCI bus, an EISA bus, or the like. The bus may be classified into an address bus, a data bus, a control bus, and the like. For ease of denotation, only one bidirectional arrow is used in FIG. 11, but it does not indicate that there is only one bus or one type of bus. In a specific application, the transmitter 1101 and the receiver 1104 may be coupled to an antenna 1105.

The memory 1103 is configured to store a program. Specifically, the program may include program code, and the program code includes a computer operation instruction. The memory 1103 may include a read-only memory and a random access memory, and provide an instruction and data for the processor 1102. The memory 1103 may include a high-speed RAM memory, and may also include a non-volatile memory (non-volatile memory), for example, at least one disk memory.

The processor 1102 executes the program stored in the memory 1103, and is specifically configured to execute the following operations:

determining a quantity of polar codes used to code a to-be-transmitted data block and a block length of each polar code of the polar codes used to code the to-be-transmitted data block; and determining, according to a quantity of bits of the to-be-transmitted data block, the block length of each polar code of the polar codes used to code the to-be-transmitted data block, and an input composite channel characteristic corresponding to each input bit position in the polar code of the polar codes used to code the to-be-transmitted data block, allocation information of valid input bits of the polar code of the polar codes used to code the to-be-transmitted data block.

The quantity of polar codes used to code the to-be-transmitted data block is not less than two, and the quantity of bits of the to-be-transmitted data block exceeds a quantity of input bits that can be supported by any polar code of the polar codes used to code the to-be-transmitted data block.

In the present invention, the foregoing method that is executed by the coding apparatus and that is disclosed in the embodiment shown in FIG. 1 or FIG. 2 and the method that is executed by the UE and that is disclosed in the embodiment shown in FIG. 3 or FIG. 4 can be applied to the processor 1102, or implemented by the processor 1102. The processor 1102 may be an integrated circuit chip and has a signal processing capability. In an implementation process, each step in the foregoing method may be completed by hardware, that is, an integrated logical circuit in the processor 1102 or by an instruction in a software form. The processor 1102 may be a universal processor, including a central processing unit (Central Processing Unit, CPU for short), a network processor (Network Processor, NP for short), or the like, or may be a digital signal processor (DSP), an application-specific integrated circuit (ASIC), a field programmable gate array (FPGA), or another programmable logic device, discrete gate or transistor logic device, or discrete hardware component. The processor 1102 may implement or execute methods, steps or logical block diagrams disclosed in this embodiment of the present invention. The universal processor may be a microprocessor, or the processor may be any conventional processor or the like. The steps in the methods disclosed in the embodiments of the present invention may be completed by a hardware decoding processor, or completed by a combination of hardware and software modules in a decoding processor. The software module may be located in a mature storage medium in the art, such as a random memory, a flash memory, a read-only memory, a programmable read-only memory or an electrically erasable programmable memory, or a register. The storage medium is located in the memory 1103. The processor 1102 reads information in the memory 1103, and completes the steps in the foregoing method by using the hardware.

In this embodiment of the present invention, when the coding apparatus 1100 uses multiple polar codes to transmit data, an input bit position, corresponding to a relatively excellent input composite channel characteristic, of all input bit positions in the multiple polar codes is selected as an information bit position according to input composite channel characteristics corresponding to input bit positions in the polar codes, so that relatively excellent coding performance can be obtained.

Optionally, in an embodiment, in the process of determining a quantity of polar codes used to code a to-be-transmitted data block and a block length of each polar code of the polar codes used to code the to-be-transmitted data block, the processor 1102 is specifically configured to: receive, by using the receiver 1104, resource assignment information sent by a peer node, and determine, according to the resource assignment information, the quantity of polar codes used to code the to-be-transmitted data block and block length information of each polar code of the polar codes used to code the to-be-transmitted data block. The resource assignment information carries the quantity of polar codes used to code the to-be-transmitted data block and the block length information of each polar code of the polar codes used to code the to-be-transmitted data block.

Optionally, in another embodiment, in the process of determining a quantity of polar codes used to code a to-be-transmitted data block and a block length of each polar code of the polar codes used to code the to-be-transmitted data block, the processor 1102 is specifically configured to determine, according to the quantity of bits of the to-be-transmitted data block, the quantity of polar codes used to code the to-be-transmitted data block and the block length of each polar code of the polar codes used to code the to-be-transmitted data block.

Optionally, in an embodiment, in the process of determining, according to the quantity of bits of the to-be-transmitted data block, the block length of each polar code of the polar codes used to code the to-be-transmitted data block, and the input composite channel characteristic corresponding to each input bit position in the polar code of the polar codes used to code the to-be-transmitted data block, the allocation information of valid input bits of the polar code of the polar codes used to code the to-be-transmitted data block, the processor 1102 is specifically configured to allocate, one by one from excellent to poor according to the block length of each polar code of the polar codes used to code the to-be-transmitted data block and the input composite channel characteristic corresponding to each input bit position in the polar code of the polar codes used to code the to-be-transmitted data block, valid input bits of the polar code of the polar codes used to code the to-be-transmitted data block, till all bits of the to-be-transmitted data block are allocated.

Optionally, in another embodiment, in the process of determining, according to a quantity of bits of the to-be-transmitted data block, the block length of each polar code of the polar codes used to code the to-be-transmitted data block, and an input composite channel characteristic corresponding to each input bit position in the polar code of the polar codes used to code the to-be-transmitted data block, allocation information of valid input bits of the polar code of the polar codes used to code the to-be-transmitted data block, the processor 1102 is specifically configured to allocate, one by one from poor to excellent according to the block length of each polar code of the polar codes used to code the to-be-transmitted data block and the input composite channel characteristic corresponding to each input bit position in the polar code of the polar codes used to code the to-be-transmitted data block, padding bits of the polar code of the polar codes used to code the to-be-transmitted data block, till all padding bits required for coding the to-be-transmitted data block are allocated.

Optionally, in another embodiment, in the process of determining, according to a quantity of bits of the to-be-transmitted data block, the block length of each polar code of the polar codes used to code the to-be-transmitted data block, and an input composite channel characteristic corresponding to each input bit position in the polar code of the polar codes used to code the to-be-transmitted data block, allocation information of valid input bits of the polar code of the polar codes used to code the to-be-transmitted data block, the processor 1102 is specifically configured to allocate, according to the quantity of bits of the to-be-transmitted data block, the block length of each polar code of the polar codes used to code the to-be-transmitted data block, and the input composite channel characteristic corresponding to each input hit position in the polar code of the polar codes used to code the to-be-transmitted data block, a content bit of the to-be-transmitted data block to an input bit position, corresponding to a relatively excellent input composite channel characteristic, in the polar code used to code the to-be-transmitted data block, so that a difference between quantities of valid input bits of any two polar codes of the polar codes used to code the to-be-transmitted data block is less than a first predetermined threshold. A quantity of valid input bits of the polar code is a quantity of content bits allocated to the to-be-transmitted data block, and each polar code of the polar codes used to code the to-be-transmitted data block has a same block length.

Optionally, in another embodiment, in the process of determining, according to a quantity of bits of the to-be-transmitted data block, the block length of each polar code of the polar codes used to code the to-be-transmitted data block, and an input composite channel characteristic corresponding to each input bit position in the polar code of the polar codes used to code the to-be-transmitted data block, allocation information of valid input bits of the polar code of the polar codes used to code the to-be-transmitted data block, the processor 1102 is specifically configured to allocate, according to the quantity of bits of the to-be-transmitted data block, the block length of each polar code of the polar codes used to code the to-be-transmitted data block, and the input composite channel characteristic corresponding to each input bit position in the polar code of the polar codes used to code the to-be-transmitted data block, a padding bit required for coding the to-be-transmitted data block to an input bit position, corresponding to a relatively poor input composite channel characteristic, in the polar code used to code the to-be-transmitted data block, so that a difference between quantities of valid input bits of any two polar codes of the polar codes used to code the to-be-transmitted data block is less than a first predetermined threshold, and allocate a content bit of the to-be-transmitted data block to a remaining input bit position in the polar code of the polar codes used to code the to-be-transmitted data block. A quantity of valid input bits of the polar code is a quantity of content bits allocated to the to-be-transmitted data block, and each polar code of the polar codes used to code the to-be-transmitted data block has a same block length.

Preferably, the first predetermined threshold is equal to five times a highest modulation order of all modulation orders of the polar codes used to code the to-be-transmitted data block.

Optionally, the input composite channel characteristic includes at least one of the following: a capacity of an input composite channel, an error probability of an input composite channel, or a position indicator corresponding to an input composite channel.

Further, the position indicator corresponding to an input composite channel is obtained by means of calculation according to a parameter equation corresponding to a polar code of the input composite channel and an input bit position corresponding to the input composite channel; or the position indicator corresponding to an input composite channel is obtained by means of table lookup according to an indicator mapping table corresponding to a polar code of the input composite channel and an input bit position corresponding to the input composite channel. The indicator mapping table is used to indicate a mapping relationship between an input bit position in a polar code and a position indicator corresponding to an input composite channel.

Optionally, the processor 1102 is further configured to determine, according to a quantity of bits that can be transmitted by a physical transmission resource block of the to-be-transmitted data block, the block length of each polar code of the polar codes used to code the to-be-transmitted data block, and an output composite channel characteristic corresponding to each output bit position in the polar code of the polar codes used to code the to-be-transmitted data block, allocation information of valid output bits of the polar code of the polar codes used to code the to-be-transmitted data block.

In this embodiment of the present invention, when using multiple polar codes to transmit data, the coding apparatus 1100 further selects an output bit position, corresponding to a relatively excellent output composite channel characteristic, of all output bit positions in the multiple polar codes as a coding bit position according to output composite channel characteristics corresponding to output bit positions in the polar codes, so as to obtain relatively excellent coding performance.

Optionally, in an embodiment, in the process of determining, according to a quantity of bits that can be transmitted by a physical transmission resource block of the to-be-transmitted data block, the block length of each polar code of the polar codes used to code the to-be-transmitted data block, and an output composite channel characteristic corresponding to each output bit position in the polar code of the polar codes used to code the to-be-transmitted data block, allocation information of valid output bits of the polar code of the polar codes used to code the to-be-transmitted data block, the processor 1102 is specifically configured to allocate, one by one from excellent to poor according to the block length of each polar code of the polar codes used to code the to-be-transmitted data block and the output composite channel characteristic corresponding to each output bit position in the polar code of the polar codes used to code the to-be-transmitted data block, the valid output bits of the polar code of the polar codes used to code the to-be-transmitted data block, till all bits that can be transmitted by the physical transmission resource block of the to-be-transmitted data block are allocated.

Optionally, in another embodiment, in the process of determining, according to a quantity of bits that can be transmitted by a physical transmission resource block of the to-be-transmitted data block, the block length of each polar code of the polar codes used to code the to-be-transmitted data block, and an output composite channel characteristic corresponding to each output bit position in the polar code of the polar codes used to code the to-be-transmitted data block, allocation information of valid output bits of the polar code of the polar codes used to code the to-be-transmitted data block, the processor 1102 is specifically configured to allocate, one by one from poor to excellent according to the block length of each polar code of the polar codes used to code the to-be-transmitted data block and the output composite channel characteristic corresponding to each output bit position in the polar code of the polar codes used to code the to-be-transmitted data block, punctured bits of the polar code of the polar codes used to code the to-be-transmitted data block, till all punctured bits required for transmitting the to-be-transmitted data block are allocated. A quantity of the punctured bits required for transmitting the to-be-transmitted data block is equal to a sum of block lengths of the polar codes used to code the to-be-transmitted data block minus the quantity of bits that can be transmitted by the physical transmission resource block of the to-be-transmitted data block.

Optionally, in another embodiment, in the process of determining, according to a quantity of bits that can be transmitted by a physical transmission resource block of the to-be-transmitted data block, the block length of each polar code of the polar codes used to code the to-be-transmitted data block, and an output composite channel characteristic corresponding to each output bit position in the polar code of the polar codes used to code the to-be-transmitted data block, allocation information of valid output bits of the polar code of the polar codes used to code the to-be-transmitted data block, the processor 1102 is specifically configured to allocate, according to the block length of each polar code of the polar codes used to code the to-be-transmitted data block and the output composite channel characteristic corresponding to each output bit position in the polar code of the polar codes used to code the to-be-transmitted data block, a bit that can be transmitted by the physical transmission resource block of the to-be-transmitted data block to an output bit position, corresponding to a relatively excellent output composite channel characteristic, in the polar code used to code the to-be-transmitted data block, so that a difference between quantities of valid output bits of any two polar codes of the polar codes used to code the to-be-transmitted data block is less than a second predetermined threshold. A quantity of valid output bits of the polar code is a quantity of remaining bits obtained after output bits of the polar code are punctured, and each polar code of the polar codes used to code the to-be-transmitted data blocks has a same block length.

Optionally, in another embodiment, in the process of determining, according to a quantity of bits that can be transmitted by a physical transmission resource block of the to-be-transmitted data block, the block length of each polar code of the polar codes used to code the to-be-transmitted data block, and an output composite channel characteristic corresponding to each output bit position in the polar code of the polar codes used to code the to-be-transmitted data block, allocation information of valid output bits of the polar code of the polar codes used to code the to-be-transmitted data block, the processor 1102 is specifically configured to allocate, according to the block length of each polar code of the polar codes used to code the to-be-transmitted data block and the output composite channel characteristic corresponding to each output bit position in the polar code of the polar codes used to code the to-be-transmitted data block, a punctured bit required for coding the to-be-transmitted data block to an output bit position, corresponding to a relatively poor output composite channel characteristic, in the polar code used to code the to-be-transmitted data block, so that difference between quantities of valid output bits of any two polar codes of the polar codes used to code the to-be-transmitted data block is less than a second predetermined threshold, and allocate a bit that can be transmitted by the physical transmission resource block of the to-be-transmitted data block to a remaining output bit position in the polar code of the polar codes used to code the to-be-transmitted data block. A quantity of valid output bits of the polar code is equal to a block length of the polar code minus a quantity of punctured bits of the polar code, and each polar code of the polar codes used to code the to-be-transmitted data blocks has a same block length.

Preferably, the second predetermined threshold is equal to six times a highest modulation order of all modulation orders of the polar codes used to code the to-be-transmitted data block.

Optionally, the output composite channel characteristic includes at least one of the following: a capacity of an output composite channel, an error probability of an output composite channel, or a position indicator corresponding to an output composite channel.

Further, the position indicator corresponding to an output composite channel is obtained by means of calculation according to a parameter equation corresponding to a polar code of the output composite channel and an output bit position corresponding to the output composite channel; or the position indicator corresponding to an output composite channel is obtained by means of table lookup according to an indicator mapping table corresponding to a polar code of the output composite channel and an output bit position corresponding to the output composite channel.

The coding apparatus 1100 may further execute the method in FIG. 1 or FIG. 2, and implement the coding apparatus function executed by the UE in the embodiment shown in FIG. 3 or FIG. 4. This is not described in this embodiment of the present invention.

Figure 12:
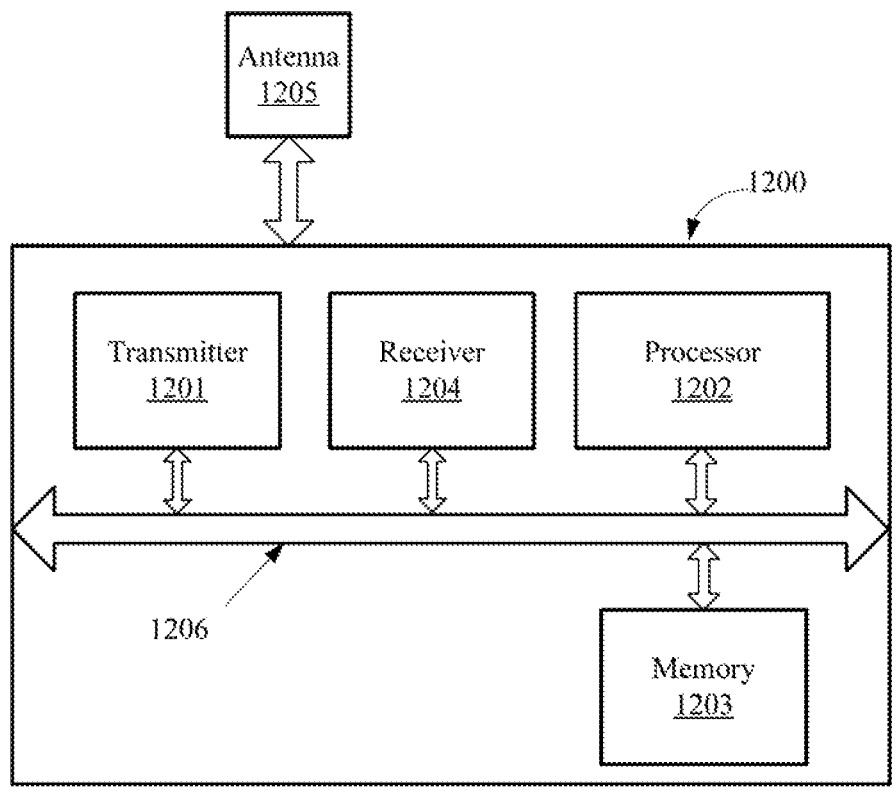
FIG. 12 is a schematic structural diagram of another coding apparatus according to an embodiment of the present invention.

FIG. 12 is a schematic structural diagram of a coding apparatus 1200 according to an embodiment of the present invention. The coding apparatus 1200 may include a transmitter 1201, a receiver 1204, a processor 1202, and a memory 1203.

The transmitter 1201, the receiver 1204, the processor 1202, and the memory 1203 are connected to each other by using a bus 1206 system. The bus 1206 may be an ISA bus, a PCI bus, an EISA bus, or the like. The bus may be classified into an address bus, a data bus, a control bus, and the like. For ease of denotation, only one bidirectional arrow is used in FIG. 12, but it does not indicate that there is only one bus or one type of bus. In a specific application, the transmitter 1201 and the receiver 1204 may be coupled to an antenna 1205.

The memory 1203 is configured to store a program. Specifically, the program may include program code, and the program code includes a computer operation instruction. The memory 1203 may include a read-only memory and a random access memory, and provide an instruction and data for the processor 1202. The memory 1203 may include a high-speed RAM memory, and may also include a non-volatile memory (non-volatile memory), for example, at least one disk memory.

The processor 1202 executes the program stored in the memory 1203, and is specifically configured to execute the following operations:

determining a quantity of polar codes used to code a to-be-transmitted data block and a block length of each polar code of the polar codes used to code the to-be-transmitted data block; and determining, according to a quantity of bits that can be transmitted by a physical transmission resource block of the to-be-transmitted data block, the block length of each polar code of the polar codes used to code the to-be-transmitted data block, and an output composite channel characteristic corresponding to each output bit position in the polar code of the polar codes used to code the to-be-transmitted data block, allocation information of valid output bits of the polar code of the polar codes used to code the to-be-transmitted data block.

The quantity of polar codes used to code the to-be-transmitted data block is not less than two, and a quantity of bits of the to-be-transmitted data block exceeds a quantity of input bits that can be supported by any polar code of the polar codes used to code the to-be-transmitted data block.

Certainly, it should be understood that before determining the allocation information of valid output bits of the polar code, the processor 1202 further executes the following method: determining allocation information of valid input bits of each polar code of the polar codes used to code the to-be-transmitted data block. For specific implementation of determining the allocation information of valid input bits, reference may be made to a method of determining allocation information of valid input bits of a polar code in the prior art, or reference may be made to step 102 in FIG. 1. This is not described in this embodiment of the present invention.

In the present invention, the foregoing method that is executed by the coding apparatus and that is disclosed in the embodiment shown in FIG. 8 and the method, of allocating valid output bits of a polar code, executed by the UE and disclosed in the embodiment shown in FIG. 3 or FIG. 4 can be applied to the processor 1202, or implemented by the processor 1202. The processor 1202 may be an integrated circuit chip and has a signal processing capability. In an implementation process, each step in the foregoing method may be completed by hardware, that is, an integrated logical circuit in the processor 1202 or by an instruction in a software form. The processor 1202 may be a universal processor, including a central processing unit (Central Processing Unit, CPU for short), a network processor (Network Processor, NP for short), or the like, or may be a digital signal processor (DSP), an application-specific integrated circuit (ASIC), a field programmable gate array (FPGA), or another programmable logic device, discrete gate or transistor logic device, or discrete hardware component. The processor 1202 may implement or execute methods, steps or logical block diagrams disclosed in this embodiment of the present invention. The universal processor may be a microprocessor, or the processor may be any conventional processor or the like. The steps in the methods disclosed in the embodiments of the present invention may be completed by a hardware decoding processor, or completed by a combination of hardware and software modules in a decoding processor. The software module may be located in a mature storage medium in the art, such as a random memory, a flash memory, a read-only memory, a programmable read-only memory or an electrically erasable programmable memory, or a register. The storage medium is located in the memory 1203. The processor 1202 reads information in the memory 1203, and completes the steps in the foregoing method by using the hardware.

In this embodiment of the present invention, when using multiple polar codes to transmit data, the coding apparatus 1200 further selects an output bit position, corresponding to a relatively excellent output composite channel characteristic, of all output hit positions in the multiple polar codes as a coding bit position according to output composite channel characteristics corresponding to output bit positions in the polar codes, so as to obtain relatively excellent coding performance.

Optionally, in an embodiment, in the process of determining a quantity of polar codes used to code a to-betransmitted data block and a block length of each polar code of the polar codes used to code the to-be-transmitted data block, the processor 1202 is specifically configured to: receive, by using the receiver 1204, resource assignment information sent by a peer node, and determine, according to the resource assignment information, the quantity of polar codes used to code the to-be-transmitted data block and block length information of each polar code of the polar codes used to code the to-be-transmitted data block. The resource assignment information carries the quantity of polar codes used to code the to-be-transmitted data block and the block length information of each polar code of the polar codes used to code the to-be-transmitted data block.

Optionally, in another embodiment, in the process of determining a quantity of polar codes used to code a to-be-transmitted data block and a block length of each polar code of the polar codes used to code the to-be-transmitted data block, the processor 1202 is specifically configured to determine, according to the quantity of bits of the to-be-transmitted data block, the quantity of polar codes used to code the to-be-transmitted data block and the block length of each polar code of the polar codes used to code the to-be-transmitted data block.

Optionally, in an embodiment, in the process of determining, according to a quantity of bits that can be transmitted by a physical transmission resource block of the to-be-transmitted data block, the block length of each polar code of the polar codes used to code the to-be-transmitted data block, and an output composite channel characteristic corresponding to each output bit position in the polar code of the polar codes used to code the to-be-transmitted data block, allocation information of valid output bits of the polar code of the polar codes used to code the to-be-transmitted data block, the processor 1202 is specifically configured to allocate, one by one from excellent to poor according to the block length of each polar code of the polar codes used to code the to-be-transmitted data block and the output composite channel characteristic corresponding to each output bit position in the polar code of the polar codes used to code the to-be-transmitted data block, the valid output bits of the polar code of the polar codes used to code the to-be-transmitted data block, till all bits that can be transmitted by the physical transmission resource block of the to-be-transmitted data block are allocated.

Optionally, in another embodiment, in the process of determining, according to a quantity of bits that can be transmitted by a physical transmission resource block of the to-be-transmitted data block, the block length of each polar code of the polar codes used to code the to-be-transmitted data block, and an output composite channel characteristic corresponding to each output bit position in the polar code of the polar codes used to code the to-be-transmitted data block, allocation information of valid output bits of the polar code of the polar codes used to code the to-be-transmitted data block, the processor 1202 is specifically configured to allocate, one by one from poor to excellent according to the block length of each polar code of the polar codes used to code the to-be-transmitted data block and the output composite channel characteristic corresponding to each output bit position in the polar code of the polar codes used to code the to-be-transmitted data block, punctured bits of the polar code of the polar codes used to code the to-be-transmitted data block, till all punctured bits required for transmitting the to-be-transmitted data block are allocated. A quantity of the punctured bits required for transmitting the to-be-transmitted data block is equal to a sum of block lengths of the polar codes used to code the to-be-transmitted data block minus the quantity of bits that can be transmitted by the physical transmission resource block of the to-be-transmitted data block.

Optionally, in another embodiment, in the process of determining, according to a quantity of bits that can be transmitted by a physical transmission resource block of the to-be-transmitted data block, the block length of each polar code of the polar codes used to code the to-be-transmitted data block, and an output composite channel characteristic corresponding to each output bit position in the polar code of the polar codes used to code the to-be-transmitted data block, allocation information of valid output bits of the polar code of the polar codes used to code the to-be-transmitted data block, the processor 1202 is specifically configured to allocate, according to the block length of each polar code of the polar codes used to code the to-be-transmitted data block and the output composite channel characteristic corresponding to each output bit position in the polar code of the polar codes used to code the to-be-transmitted data block, a bit that can be transmitted by the physical transmission resource block of the to-be-transmitted data block to an output bit position, corresponding to a relatively excellent output composite channel characteristic, in the polar code used to code the to-be-transmitted data block, so that a difference between quantities of valid output bits of any two polar codes of the polar codes used to code the to-be-transmitted data block is less than a second predetermined threshold. A quantity of valid output bits of the polar code is a quantity of remaining bits obtained after output bits of the polar code are punctured, and each polar code of the polar codes used to code the to-be-transmitted data blocks has a same block length.

Optionally, in another embodiment, in the process of determining, according to a quantity of bits that can be transmitted by a physical transmission resource block of the to-be-transmitted data block, the block length of each polar code of the polar codes used to code the to-be-transmitted data block, and an output composite channel characteristic corresponding to each output bit position in the polar code of the polar codes used to code the to-be-transmitted data block, allocation information of valid output bits of the polar code of the polar codes used to code the to-be-transmitted data block, the processor 1202 is specifically configured to allocate, according to the block length of each polar code of the polar codes used to code the to-be-transmitted data block and the output composite channel characteristic corresponding to each output bit position in the polar code of the polar codes used to code the to-be-transmitted data block, a punctured bit required for coding the to-be-transmitted data block to an output bit position, corresponding to a relatively poor output composite channel characteristic, in the polar code used to code the to-be-transmitted data block, so that difference between quantities of valid output bits of any two polar codes of the polar codes used to code the to-be-transmitted data block is less than a second predetermined threshold, and allocate a bit that can be transmitted by the physical transmission resource block of the to-be-transmitted data block to a remaining output bit position in the polar code of the polar codes used to code the to-be-transmitted data block. A quantity of valid output bits of the polar code is equal to a block length of the polar code minus a quantity of punctured bits of the polar code, and each polar code of the polar codes used to code the to-be-transmitted data blocks has a same block length.

Preferably, the second predetermined threshold is equal to six times a modulation order of all modulation orders of the polar codes used to code the to-be-transmitted data block.

Optionally, the output composite channel characteristic includes at least one of the following: a capacity of an output composite channel, an error probability of an output composite channel, or a position indicator corresponding to an output composite channel.

Further, the position indicator corresponding to an output composite channel is obtained by means of calculation according to a parameter equation corresponding to a polar code of the output composite channel and an output bit position corresponding to the output composite channel; or the position indicator corresponding to an output composite channel is obtained by means of table lookup according to an indicator mapping table corresponding to a polar code of the output composite channel and an output bit position corresponding to the output composite channel.

The coding apparatus 1200 may further execute the method in FIG. 8, and implement the function, of allocating the valid output bits of the polar code by the UE, in the embodiment shown in FIG. 3 or FIG. 4. This is not described in this embodiment of the present invention.

Figure 13:
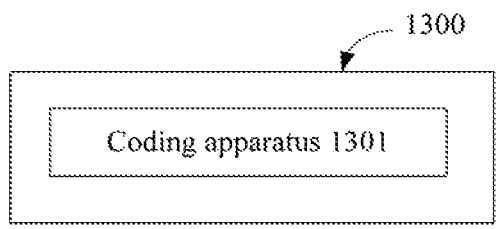
FIG. 13 is a schematic block diagram of a base station according to an embodiment of the present invention.

FIG. 13 is a schematic block diagram of a base station 1300 according to an embodiment of the present invention. As shown in FIG. 13, the base station 1300 may include a coding apparatus 1301. The coding apparatus 1301 may be the coding apparatus 500 in the embodiments shown in FIG. 5 to FIG. 7, or the coding apparatus 1100 in the embodiment shown in FIG. 11, or the coding apparatus 900 in the embodiments shown in FIG. 9 and FIG. 10, or the coding apparatus 1200 in the embodiment shown in FIG. 12. For specific implementation, reference may be made to the foregoing description. This is not described in this embodiment of the present invention. In specific implementation, the coding apparatus 1301 may be a functional module inside the base station, or a logical implementation unit of the base station, for example, an encoder.

Figure 14:
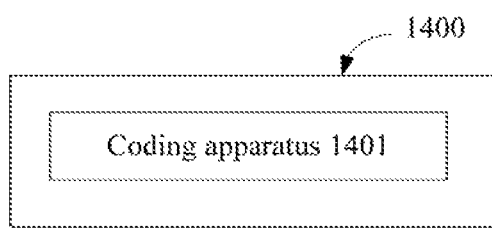
FIG. 14 is a schematic block diagram of user equipment according to an embodiment of the present invention.

FIG. 14 is a schematic block diagram of user equipment 1400 according to an embodiment of the present invention. As shown in FIG. 14, the user equipment 1400 may include a coding apparatus 1401. The coding apparatus 1401 may be the coding apparatus 500 in the embodiments shown in FIG. 5 to FIG. 7, or the coding apparatus 1100 in the embodiment shown in FIG. 11, or the coding apparatus 900 in the embodiments shown in FIG. 9 and FIG. 10, or the coding apparatus 1200 in the embodiment shown in FIG. 12. For specific implementation, reference may be made to the foregoing description. This is not described in this embodiment of the present invention. In specific implementation, the coding apparatus 1401 may be a functional module inside the user equipment, or a logical implementation unit of the user equipment, for example, an encoder.

It should be understood that sequence numbers of the foregoing processes do not mean execution sequences in various embodiments of the present invention. The execution sequences of the processes should be determined according to functions and internal logic of the processes, and should not be construed as any limitation on the implementation processes of the embodiments of the present invention.

A person of ordinary skill in the art may be aware that, in combination with the examples described in the embodiments disclosed in this specification, units and algorithm steps may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of the present invention.

It may be clearly understood by a person skilled in the art that, for the purpose of convenient and brief description, for a detailed working process of the foregoing system, apparatus, and unit, reference may be made to a corresponding process in the foregoing method embodiments, and details are not described.

In the several embodiments provided in this application, it should be understood that the disclosed system, apparatus, and method may be implemented in other manners. For example, the described apparatus embodiment is merely an example. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected according to actual needs to achieve the objectives of the solutions of the embodiments.

In addition, functional units in the embodiments of the present invention may be integrated into one processing unit, or each of the units may exist alone physically, or two or more units are integrated into one unit.

When the functions are implemented in the form of a software functional unit and sold or used as an independent product, the functions may be stored in a computer-readable storage medium. Based on such an understanding, the technical solutions of the present invention essentially, or the part contributing to the prior art, or some of the technical solutions may be implemented in a form of a software product. The software product is stored in a storage medium, and includes several instructions for instructing a computer device (which may be a personal computer, a server, or a network device) to perform all or some of the steps of the methods described in the embodiments of the present invention. The foregoing storage medium includes: any medium that can store program code, such as a USB flash drive, a removable hard disk, a read-only memory (ROM, Read-Only Memory), a random access memory (RAM, Random Access Memory), a magnetic disk, or an optical disc.

The foregoing descriptions are merely specific implementation manners of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. A coding method, wherein the method comprises:
   determining a quantity of polar codes used to code a to-be-transmitted data block and a block length of each polar code of the polar codes used to code the to-be-transmitted data block; and
   determining, according to a quantity of bits of the to-be-transmitted data block, the block length of each polar code of the polar codes used to code the to-be-transmitted data block, and an input composite channel characteristic corresponding to each input bit position in the polar code of the polar codes used to code the to-be-transmitted data block, allocation information of valid input bits of the polar code of the polar codes used to code the to-be-transmitted data block, wherein the quantity of polar codes used to code the to-be-transmitted data block is not less than two, and the quantity of bits of the to-be-transmitted data block exceeds a quantity of input bits that are supported by any polar code of the polar codes used to code the to-be-transmitted data block.

2. The method according to claim 1, wherein the determining, according to a quantity of bits of the to-be-transmitted data block, the block length of each polar code of the polar codes used to code the to-be-transmitted data block, and an input composite channel characteristic corresponding to each input bit position in the polar code of the polar codes used to code the to-be-transmitted data block, allocation information of valid input bits of the polar code of the polar codes used to code the to-be-transmitted data block comprises:

allocating, one by one from excellent to poor according to the block length of each polar code of the polar codes used to code the to-be-transmitted data block and the input composite channel characteristic corresponding to each input bit position in the polar code of the polar codes used to code the to-be-transmitted data block, the valid input bits of the polar code of the polar codes used to code the to-be-transmitted data block, till all bits of the to-be-transmitted data block are allocated.

3. The method according to claim 1, wherein the determining, according to a quantity of bits of the to-be-transmitted data block, the block length of each polar code of the polar codes used to code the to-be-transmitted data block, and an input composite channel characteristic corresponding to each input bit position in the polar code of the polar codes used to code the to-be-transmitted data block, allocation information of valid input bits of the polar code of the polar codes used to code the to-be-transmitted data block comprises:

allocating, one by one from poor to excellent according to the block length of each polar code of the polar codes used to code the to-be-transmitted data block and the input composite channel characteristic corresponding to each input bit position in the polar code of the polar codes used to code the to-be-transmitted data block, padding bits of the polar code of the polar codes used to code the to-be-transmitted data block, till all padding bits required for coding the to-be-transmitted data block are allocated.

4. The method according to claim 1, wherein the determining, according to a quantity of bits of the to-be-transmitted data block, the block length of each polar code of the polar codes used to code the to-be-transmitted data block, and an input composite channel characteristic corresponding to each input bit position in the polar code of the polar codes used to code the to-be-transmitted data block, allocation information of valid input bits of the polar code of the polar codes used to code the to-be-transmitted data block comprises:

allocating, according to the quantity of bits of the to-be-transmitted data block, the block length of each polar code of the polar codes used to code the to-be-transmitted data block, and the input composite channel characteristic corresponding to each input bit position in the polar code of the polar codes used to code the to-be-transmitted data block, a content bit of the to-be-transmitted data block to an input bit position, corresponding to relatively excellent input composite channel characteristic, in the polar code used to code the to-be-transmitted data block, so that difference between quantities of valid input bits of any two polar codes of the polar codes used to code the to-be-transmitted data block is less than a first predetermined threshold, wherein a quantity of valid input bits of the polar code is a quantity of content bits allocated to the to-be-transmitted data block, and each polar code of the polar codes used to code the to-be-transmitted data block has a same block length.

5. The method according to claim 1, wherein the determining, according to a quantity of bits of the to-be-transmitted data block, the block length of each polar code of the polar codes used to code the to-be-transmitted data block, and an input composite channel characteristic corresponding to each input bit position in the polar code of the polar codes used to code the to-be-transmitted data block, allocation information of valid input bits of the polar code of the polar codes used to code the to-be-transmitted data block comprises:

allocating, according to the quantity of bits of the to-be-transmitted data block, the block length of each polar code of the polar codes used to code the to-be-transmitted data block, and the input composite channel characteristic corresponding to each input bit position in the polar code of the polar codes used to code the to-be-transmitted data block, a padding bit required for coding the to-be-transmitted data block to an input bit position, corresponding to a relatively poor input composite channel characteristic, in the polar code used to code the to-be-transmitted data block, so that a difference between quantities of valid input bits of any two polar codes of the polar codes used to code the to-be-transmitted data block is less than a first predetermined threshold, and allocating a content bit of the to-be-transmitted data block to a remaining input bit position in the polar code of the polar codes used to code the to-be-transmitted data block, wherein a quantity of valid input bits of the polar code is a quantity of content bits allocated to the to-be-transmitted data block, and each polar code of the polar codes used to code the to-be-transmitted data block has a same block length.

6. The method according to claim 1, wherein the input composite channel characteristic comprises at least one of the following: a capacity of an input composite channel, an error probability of an input composite channel, or a position indicator corresponding to an input composite channel.

7. The method according to claim 6, wherein the position indicator corresponding to an input composite channel is obtained by means of calculation according to a parameter equation corresponding to a polar code of the input composite channel and an input bit position corresponding to the input composite channel; or the position indicator corresponding to an input composite channel is obtained by means of table lookup according to an indicator mapping table corresponding to a polar code of the input composite channel and an input bit position corresponding to the input composite channel.

8. The method according to claim 1, wherein
the method further comprises receiving resource assignment information sent by a peer node, wherein the resource assignment information carries the quantity of polar codes used to code the to-be-transmitted data block and block length information of each polar code of the polar codes used to code the to-be-transmitted data block; and
the determining a quantity of polar codes used to code a to-be-transmitted data block and a block length of each polar code of the polar codes used to code the to-be-transmitted data block comprises: determining, according to the resource assignment information, the quantity of polar codes used to code the to-be-transmitted data block and the block length information of the polar code of the polar codes used to code the to-be-transmitted data block.

9. The method according to claim 1, wherein the determining a quantity of polar codes used to code a to-be-transmitted data block and a block length of each polar code of the polar codes used to code the to-be-transmitted data block comprises:
determining, according to the quantity of bits of the to-be-transmitted data block, the quantity of polar codes used to code the to-be-transmitted data block and the block length of the polar code of the polar codes used to code the to-be-transmitted data block.

10. A coding apparatus, comprising:
a first determining unit, configured to determine a quantity of polar codes used to code a to-be-transmitted data block and a block length of each polar code of the polar codes used to code the to-be-transmitted data block; and
a second determining unit, configured to determine, according to a quantity of bits of the to-be-transmitted data block, the block length of each polar code of the polar codes used to code the to-be-transmitted data block, and an input composite channel characteristic corresponding to each input bit position in the polar code of the polar codes used to code the to-be-transmitted data block, allocation information of valid input bits of the polar code of the polar codes used to code the to-be-transmitted data block, wherein
the quantity of polar codes used to code the to-be-transmitted data block is not less than two, and the quantity of bits of the to-be-transmitted data block exceeds a quantity of input bits that are supported by any polar code of the polar codes used to code the to-be-transmitted data block.

11. The coding apparatus according to claim 10, wherein the second determining unit is configured to:
allocate, one by one from excellent to poor according to the block length of each polar code of the polar codes used to code the to-be-transmitted data block and the input composite channel characteristic corresponding to each input bit position in the polar code of the polar codes used to code the to-be-transmitted data block, the valid input bits of the polar code of the polar codes used to code the to-be-transmitted data block, till all bits of the to-be-transmitted data block are allocated.

12. The coding apparatus according to claim 10, wherein the second determining unit is configured to:
allocate, one by one from poor to excellent according to the block length of each polar code of the polar codes used to code the to-be-transmitted data block and the input composite channel characteristic corresponding to each input bit position in the polar code of the polar codes used to code the to-be-transmitted data block, padding bits of the polar code of the polar codes used to code the to-be-transmitted data block, till all padding bits required for coding the to-be-transmitted data block are allocated.

13. The coding apparatus according to claim 10, wherein the second determining unit is configured to:
allocate, according to the quantity of bits of the to-be-transmitted data block, the block length of each polar code of the polar codes used to code the to-be-transmitted data block, and the input composite channel characteristic corresponding to each input bit position in the polar code of the polar codes used to code the to-be-transmitted data block, a content bit of the to-be-transmitted data block to an input bit position, corresponding to a relatively excellent input composite channel characteristic, in the polar code used to code the to-be-transmitted data block, so that a difference between quantities of valid input bits of any two polar codes of the polar codes used to code the to-be-transmitted data block is less than a first predetermined threshold, wherein
a quantity of valid input bits of the polar code is a quantity of content bits allocated to the to-be-transmitted data block, and each polar code of the polar codes used to code the to-be-transmitted data block has a same block length.

14. The coding apparatus according to claim 10, wherein the second determining unit is configured to:
allocate, according to the quantity of bits of the to-be-transmitted data block, the block length of each polar code of the polar codes used to code the to-be-transmitted data block, and the input composite channel characteristic corresponding to each input bit position in the polar code of the polar codes used to code the to-be-transmitted data block, a padding bit required for coding the to-be-transmitted data block to an input bit position, corresponding to a relatively poor input composite channel characteristic, in the polar code used to code the to-be-transmitted data block, so that a difference between quantities of valid input bits of any two polar codes of the polar codes used to code the to-be-transmitted data block is less than a first predetermined threshold, and allocate a content bit of the to-be-transmitted data block to a remaining input bit position in the polar code of the polar codes used to code the to-be-transmitted data block, wherein
a quantity of valid input bits of the polar code is a quantity of content bits allocated to the to-be-transmitted data block, and each polar code of the polar codes used to code the to-be-transmitted data block has a same block length.

15. The coding apparatus according to claim 10, wherein
the input composite channel characteristic comprises at least one of the following: a capacity of an input composite channel, an error probability of an input composite channel, or a position indicator corresponding to an input composite channel.

16. The coding apparatus according to claim 15, wherein
the position indicator corresponding to an input composite channel is obtained by means of calculation according to a parameter equation corresponding to a polar code of the input composite channel and an input bit position corresponding to the input composite channel; or
the position indicator corresponding to an input composite channel is obtained by means of table lookup according to an indicator mapping table corresponding to a polar code of the input composite channel and an input bit position corresponding to the input composite channel.

17. The coding apparatus according to claim 10, wherein the output composite channel characteristic comprises at least one of the following: a capacity of an output composite channel, an error probability of an output composite channel, or a position indicator corresponding to an output composite channel.

18. The coding apparatus according to claim 17, wherein the position indicator corresponding to an output composite channel is obtained by means of calculation according to a parameter equation corresponding to a polar code of the output composite channel and an output bit position corresponding to the output composite channel; or the position indicator corresponding to an output composite channel is obtained by means of table lookup according to an indicator mapping table corresponding to a polar code of the output composite channel and an output bit position corresponding to the output composite channel.

19. The coding apparatus according to claim 10, wherein the coding apparatus further comprises a receiving unit, configured to receive resource assignment information sent by a peer node, wherein the resource assignment information carries the quantity of polar codes used to code the to-be-transmitted data block and block length information of each polar code of the polar codes used to code the to-be-transmitted data block; and the first determining unit is configured to determine, according to the resource assignment information, the quantity of polar codes used to code the to-be-transmitted data block and the block length information of the polar code of the polar codes used to code the to-be-transmitted data block.

20. The coding apparatus according to claim 10, wherein the first determining unit is configured to determine, according to the quantity of bits of the to-be-transmitted data block, the quantity of polar codes used to code the to-be-transmitted data block and the block length of each polar code of the polar codes used to code the to-be-transmitted data block.

21. The coding apparatus according to claim 10, wherein the coding apparatus is included in a base station or a user equipment.

* * * * *